US006857002B1

(12) United States Patent
Thomsen et al.

(10) Patent No.: US 6,857,002 B1
(45) Date of Patent: Feb. 15, 2005

(54) INTEGRATED CIRCUIT WITH A MODE CONTROL SELECTING SETTLED AND UNSETTLED OUTPUT FROM A FILTER

(75) Inventors: Axel Thomsen, Austin, TX (US); Jerome E. Johnston, Austin, TX (US); Edwin De Angel, Austin, TX (US); Aryesh Amar, Nashua, NH (US)

(73) Assignee: Cirrus Logic, Inc., Austin, TX (US)

( * ) Notice: Subject to any disclaimer, the term of this patent is extended or adjusted under 35 U.S.C. 154(b) by 469 days.

(21) Appl. No.: 09/695,704

(22) Filed: Oct. 25, 2000

Related U.S. Application Data

(60) Provisional application No. 60/216,346, filed on Jul. 5, 2000.

(51) Int. Cl.[7] .......................... G06F 17/10; G06F 13/00
(52) U.S. Cl. ...................... 708/300; 708/168; 708/305
(58) Field of Search ............................... 708/300–323, 708/160, 168

(56) References Cited

U.S. PATENT DOCUMENTS

| 5,027,306 | A | * | 6/1991 | Dattorro et al. ............ 708/313 |
| 5,600,582 | A | * | 2/1997 | Miyaguchi ................. 708/300 |
| 5,646,621 | A | * | 7/1997 | Cabler et al. ............... 341/143 |
| 5,692,020 | A | * | 11/1997 | Robbins ..................... 708/313 |
| 5,777,911 | A | * | 7/1998 | Sherry et al. .............. 708/316 |
| 5,917,735 | A | * | 6/1999 | Ko ............................. 708/313 |
| 5,987,484 | A | * | 11/1999 | Sherry et al. .............. 708/300 |
| 6,321,246 | B1 | * | 11/2001 | Page et al. ................. 708/316 |

OTHER PUBLICATIONS

Matlab, Signal Processing Toolbox for Use with Matlab: Chapter 5 Interactive Tools, 1998, the Math Works Inc, Ver. 4, pp. from 5–1 to 5–33.*

* cited by examiner

Primary Examiner—Kakali Chaki
Assistant Examiner—Chat C. Do
(74) Attorney, Agent, or Firm—Thompson & Knight LLP; James J. Murphy

(57) ABSTRACT

In a signal processing integrated circuit having an analog to digital converter and a digital filter having a plurality of taps separated in time, when starting a conversion after a reset or a change of input channel, the filter will have an incomplete set of input data as the delayed inputs to an output calculation are all zero from the reset operation. After reset, during the time that data are filling up the filter pipeline, the calculation of an output value will give a result that holds information about the input, but does not present the data with the same scaling and frequency content as the fully settled filter. The integrated circuit selectively provides two modes, on that provides only fully settled data from the filter or and another that provides all data from the filter, including unsettled data. Knowledge about the filter coefficients can be utilized by a user or user process to extract information about the input from the unsettled data.

5 Claims, 24 Drawing Sheets

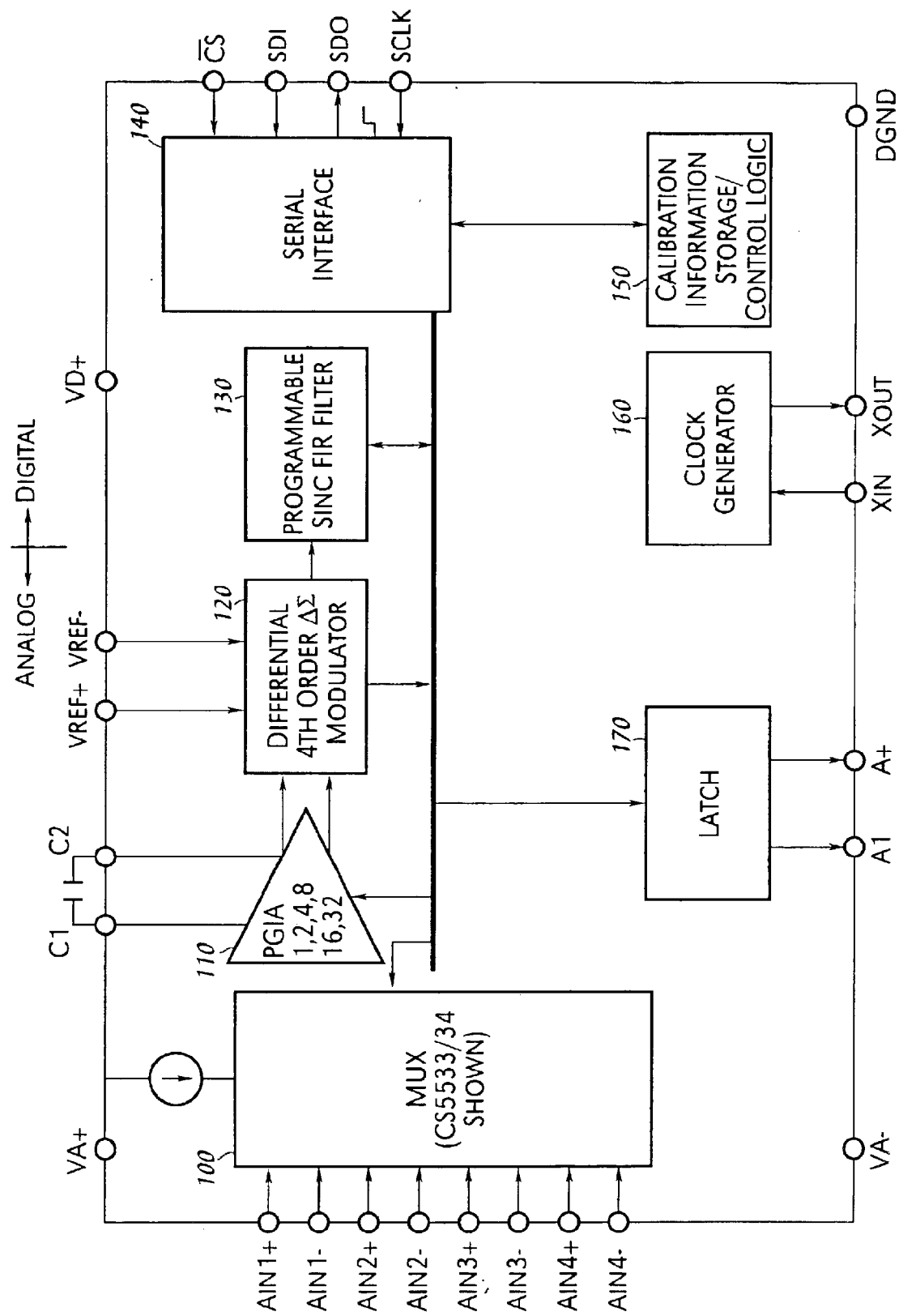
Fig. 1.1A

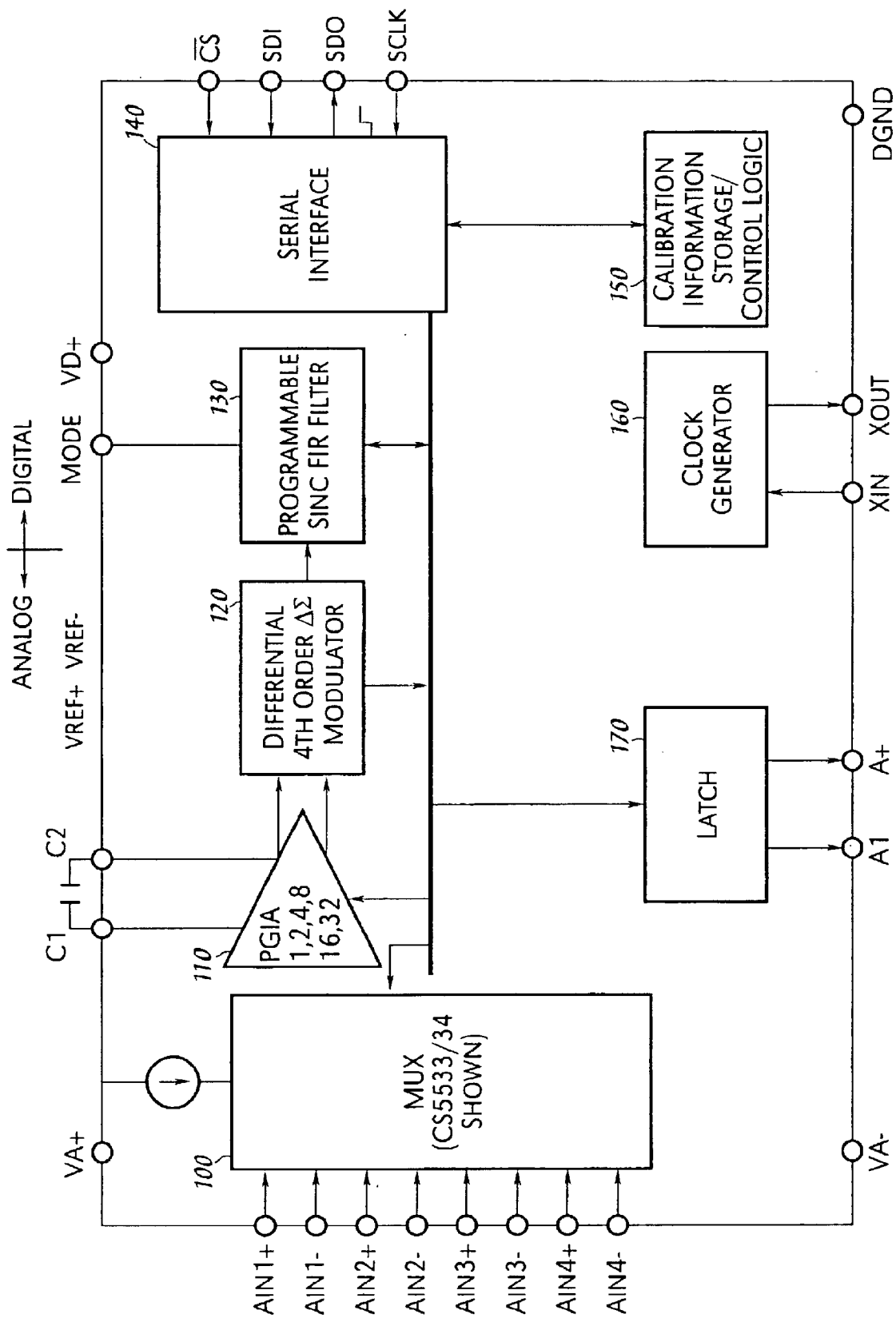
Fig. 1.1B

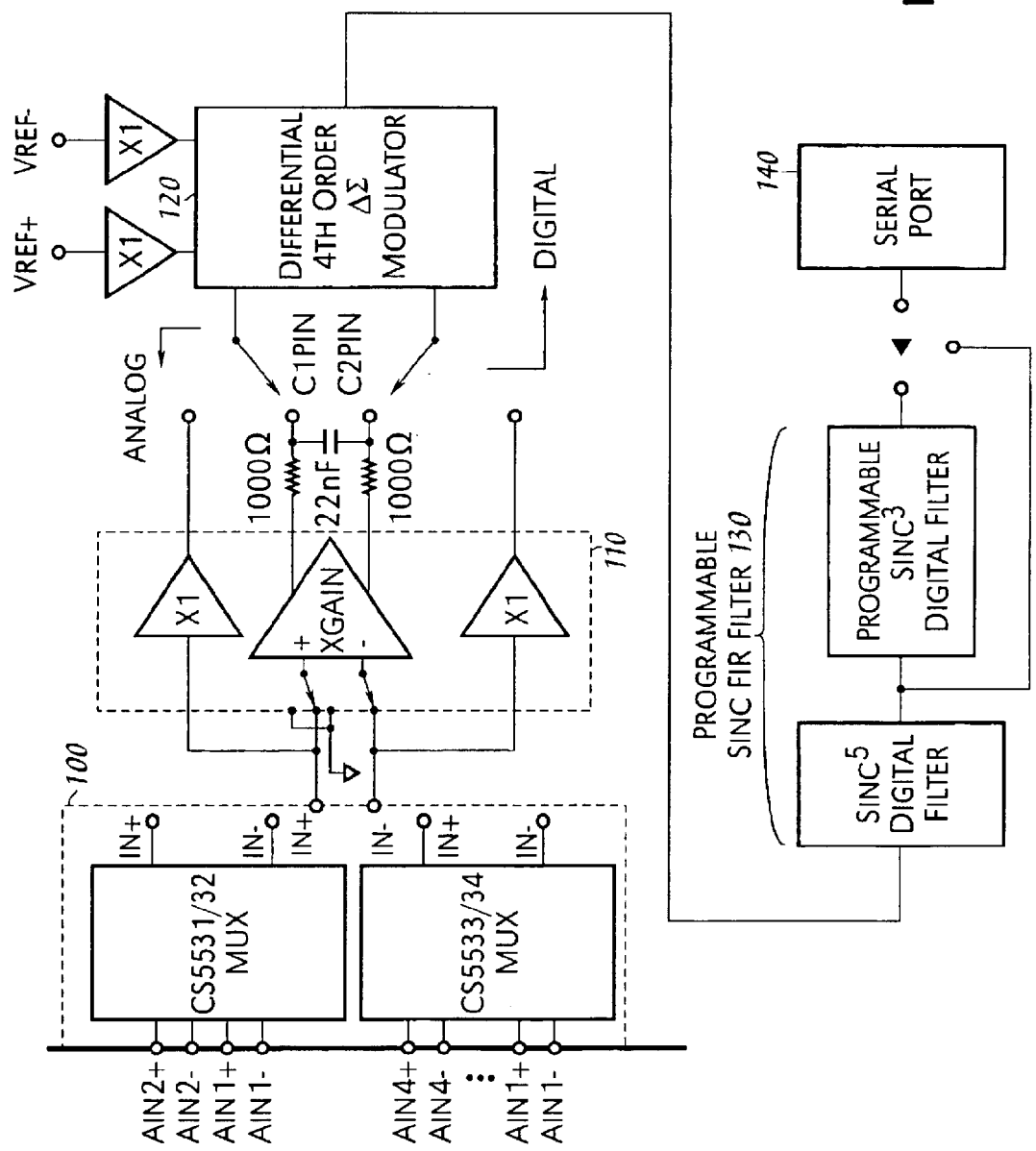
Fig. 1.2A

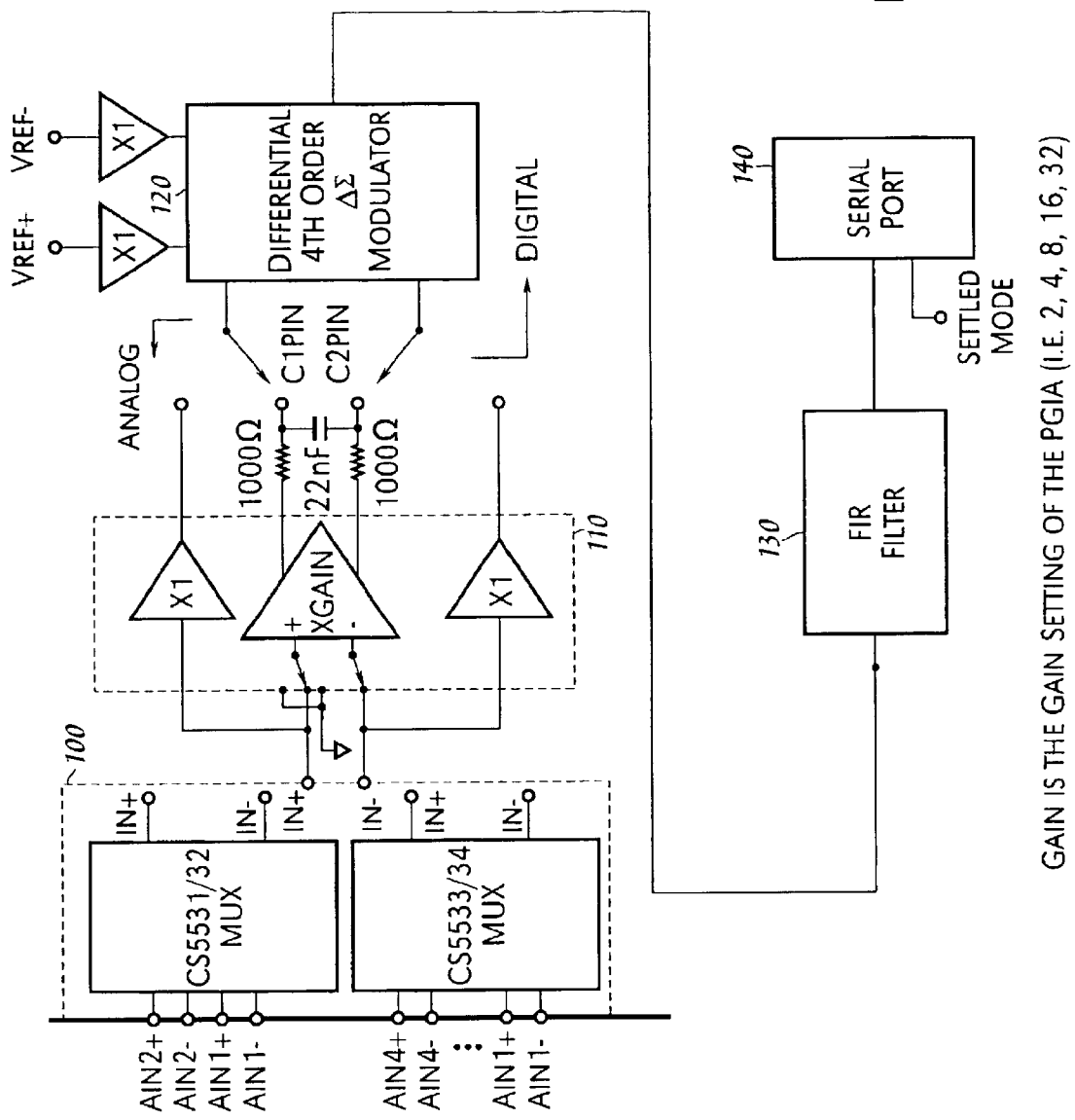
Fig. 1.2B
GAIN IS THE GAIN SETTING OF THE PGIA (I.E. 2, 4, 8, 16, 32)

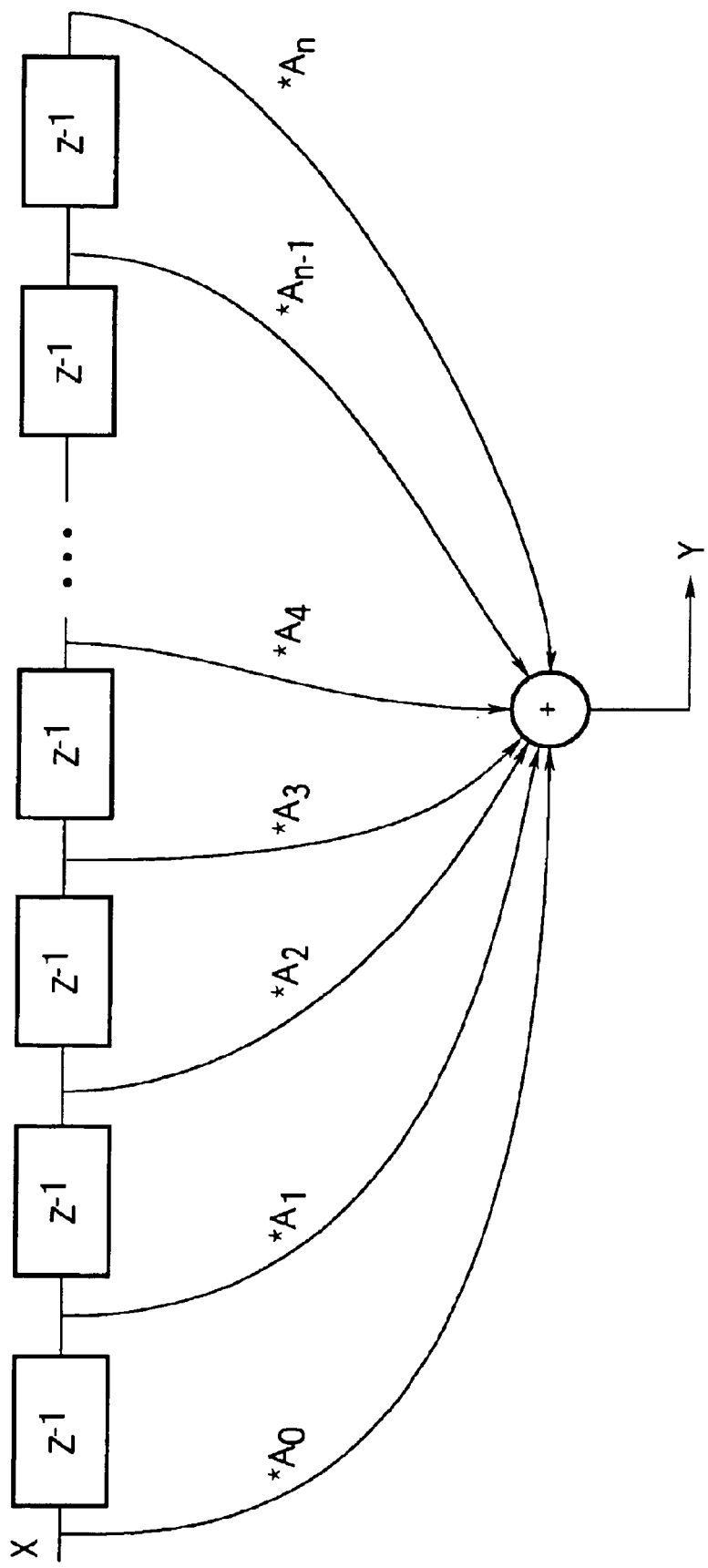
Fig. 1.2C
(Prior Art)

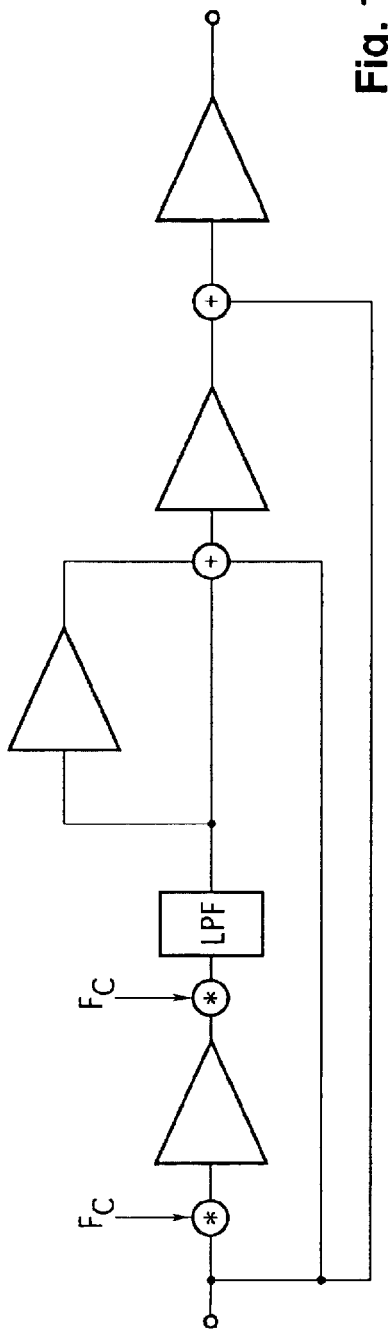
Fig. 1.3
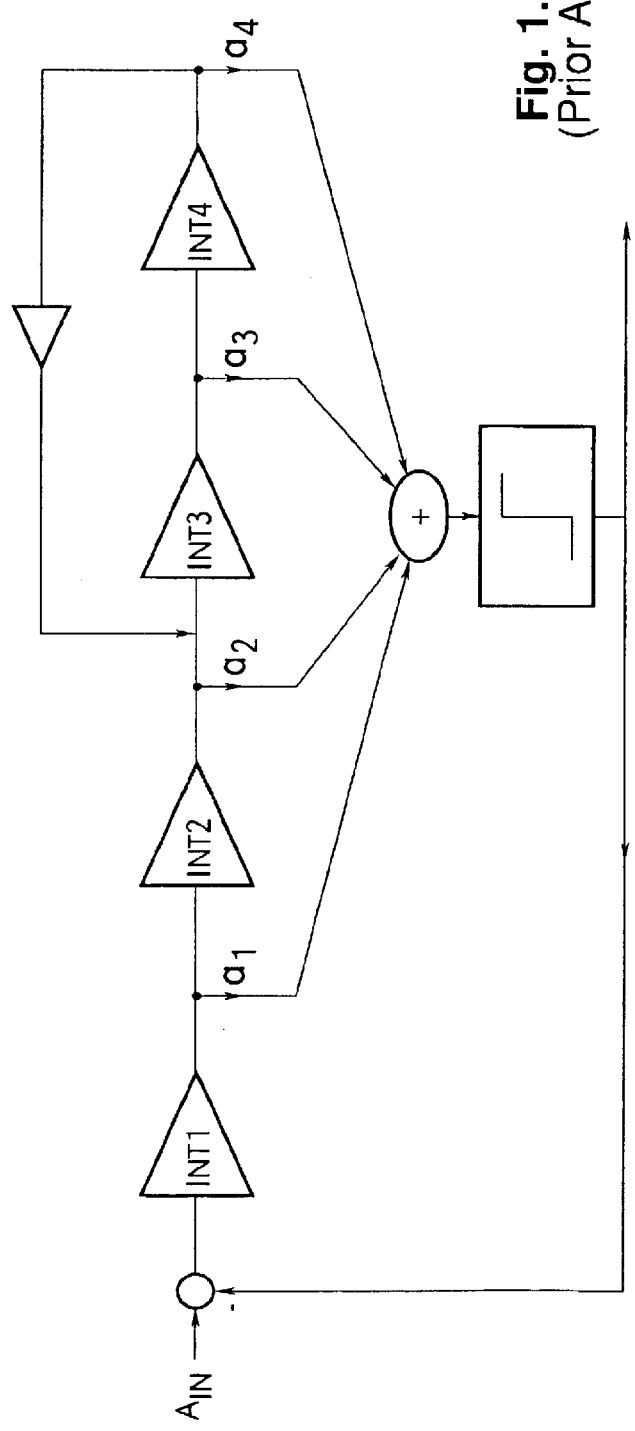
Fig. 1.4
(Prior Art)

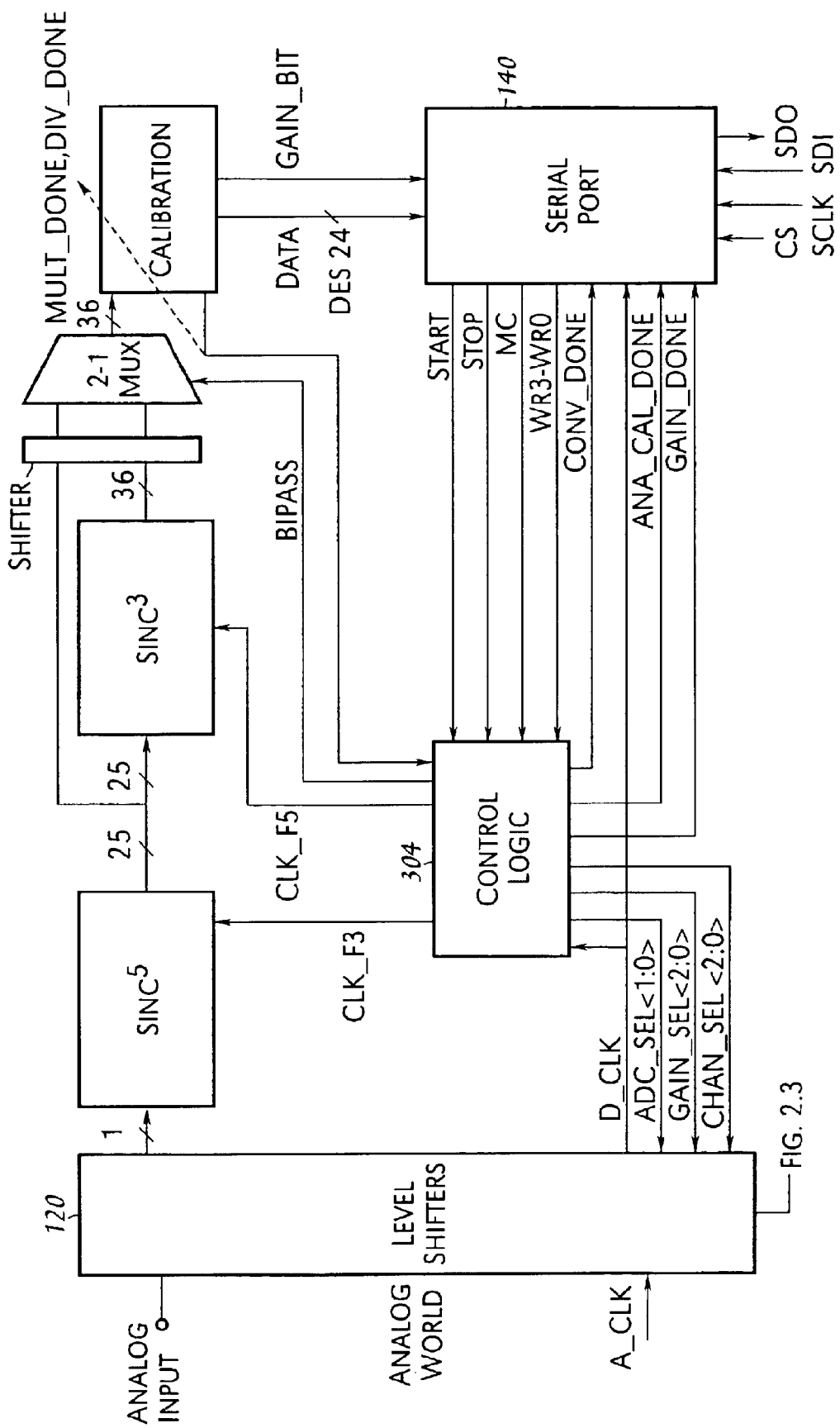
Fig. 1.5A

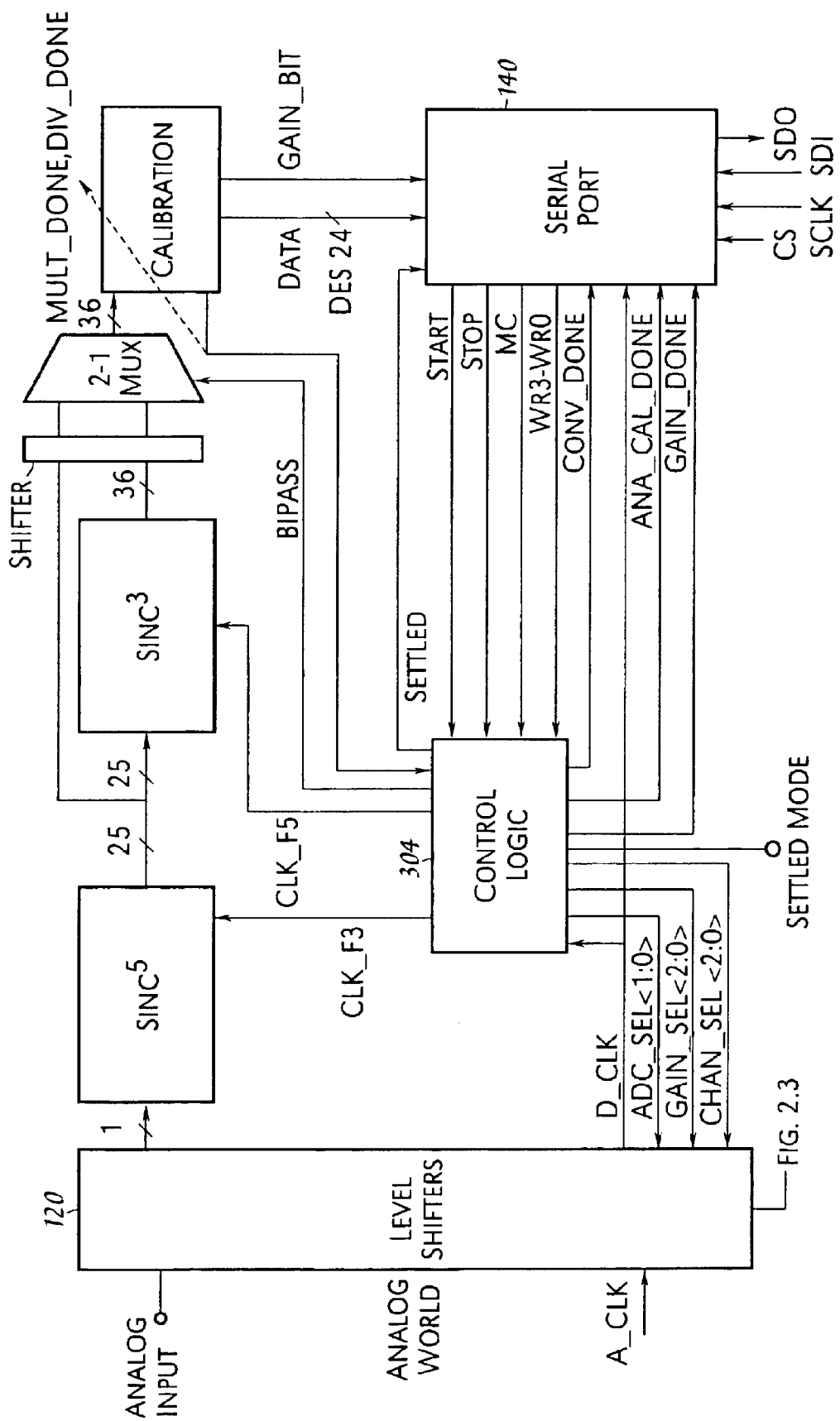
Fig. 1.5B

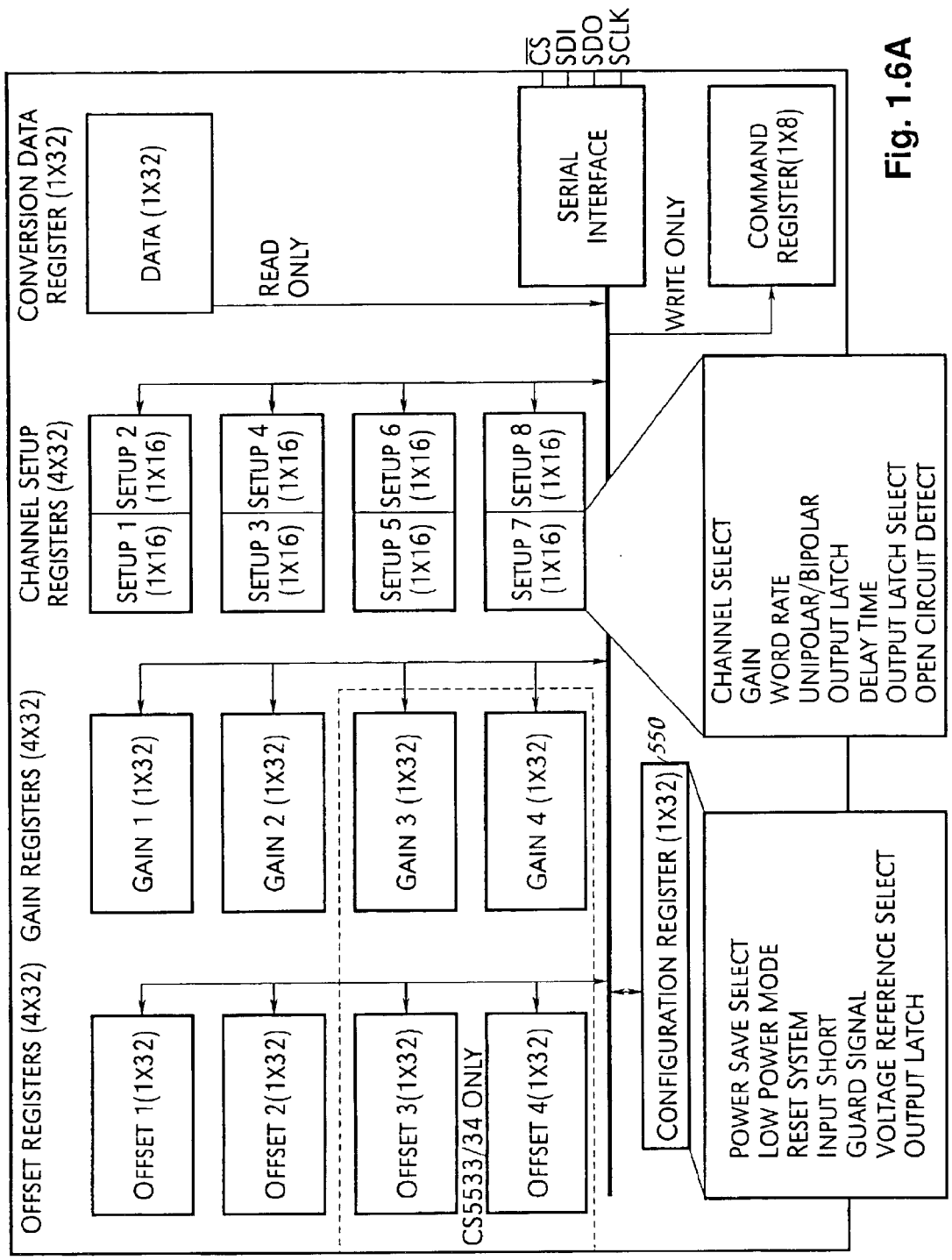
Fig. 1.6A

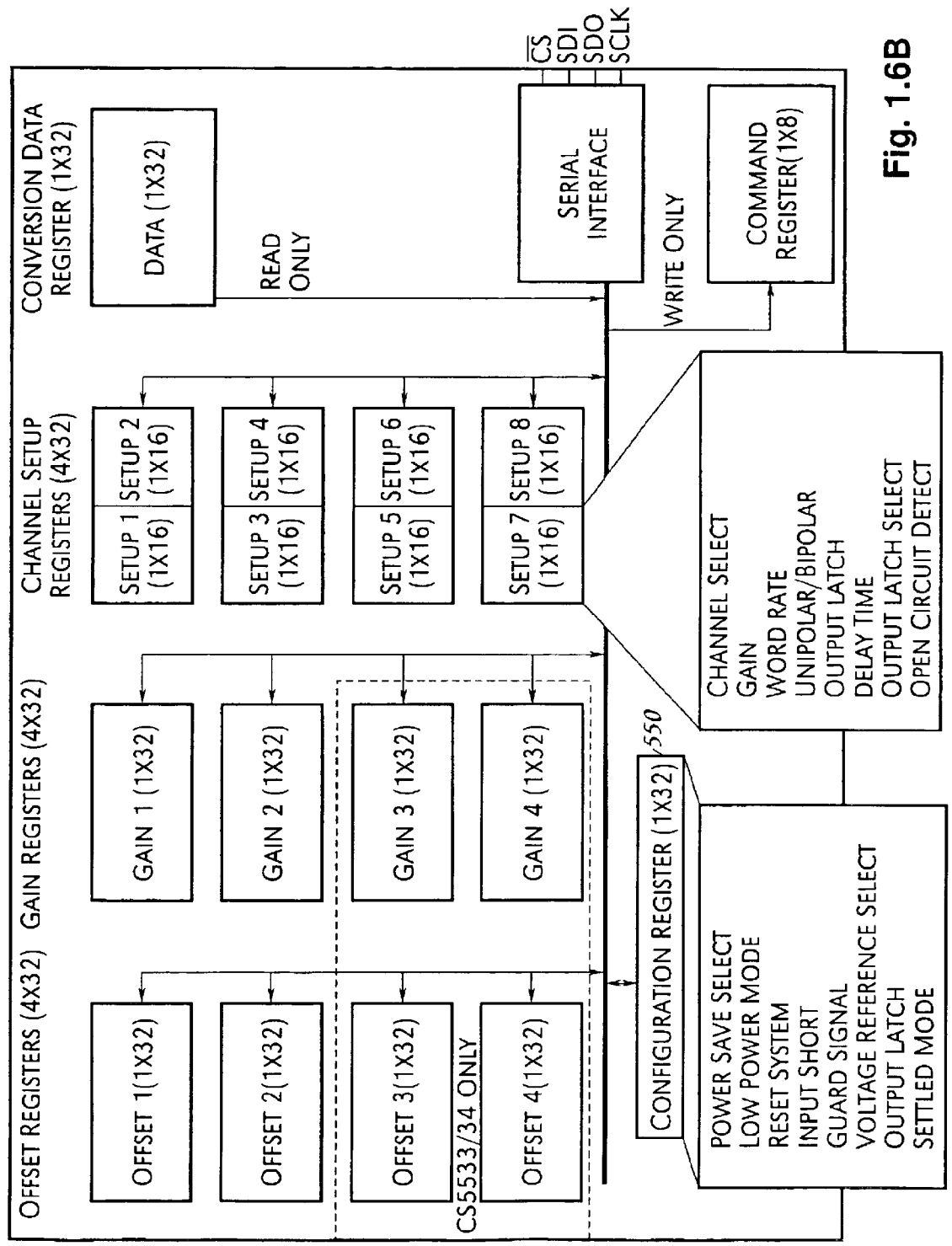
Fig. 1.6B

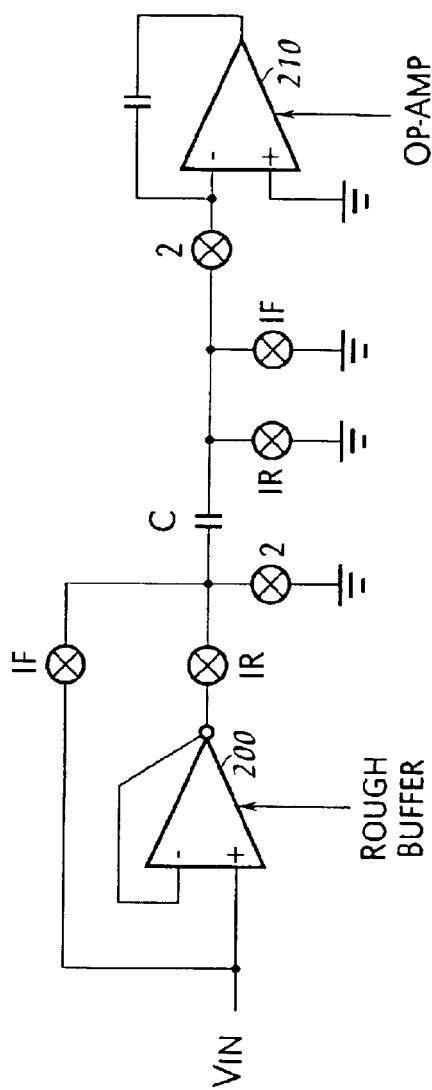
Fig. 2.0
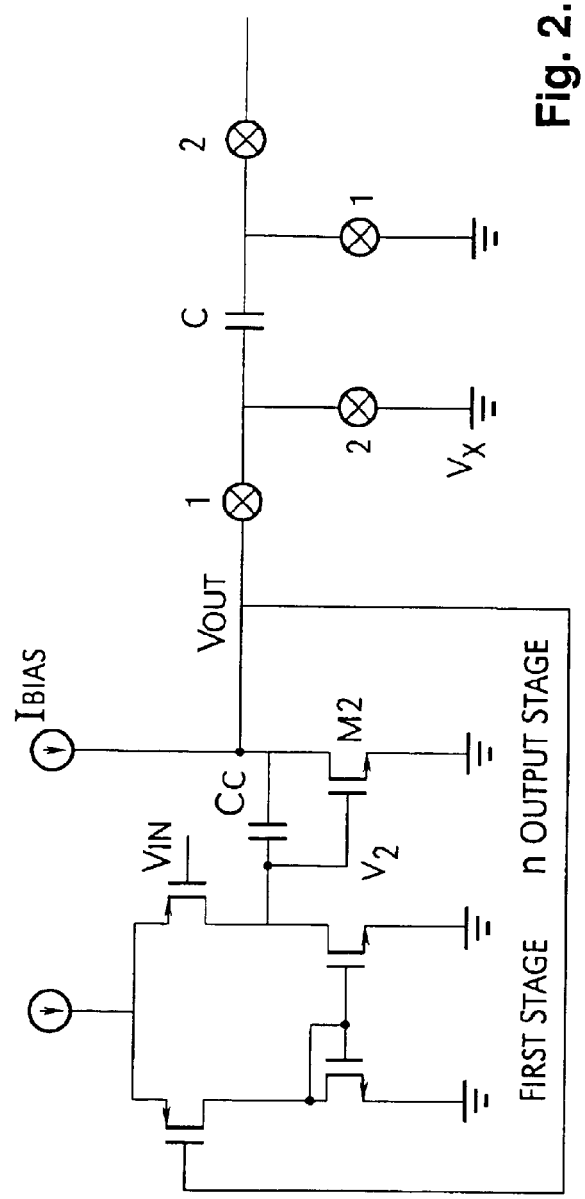
Fig. 2.1

$V_{IN}$ = CONSTANT
$V_{OUT} > V_X$
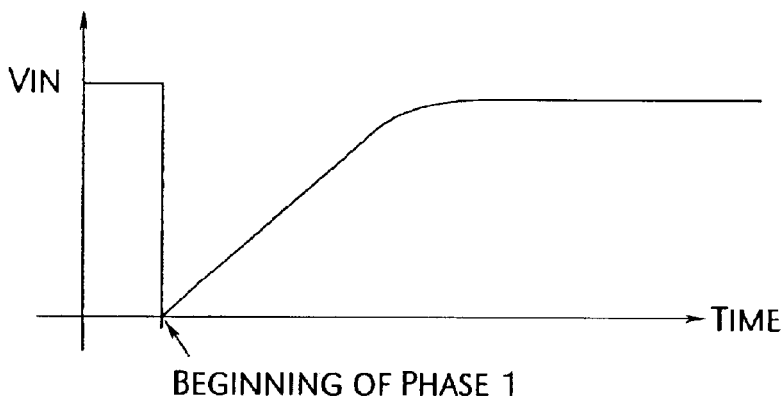
Fig. 2.2
$V_{IN}$ = CONSTANT
$V_{OUT} < V_X$
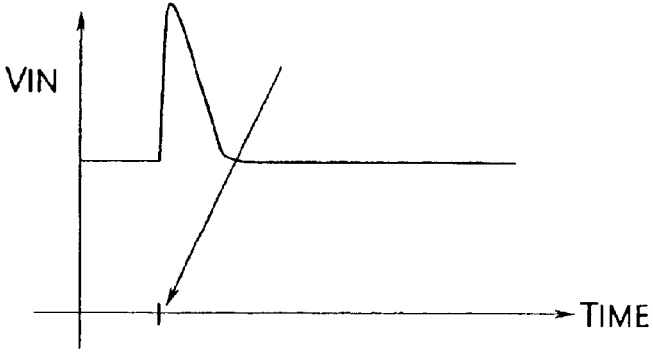
Fig. 2.3
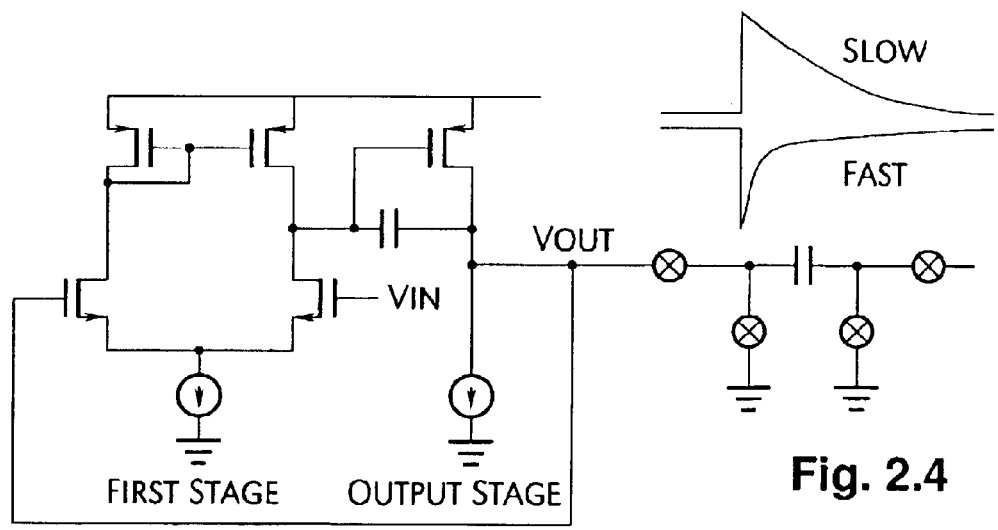
Fig. 2.4

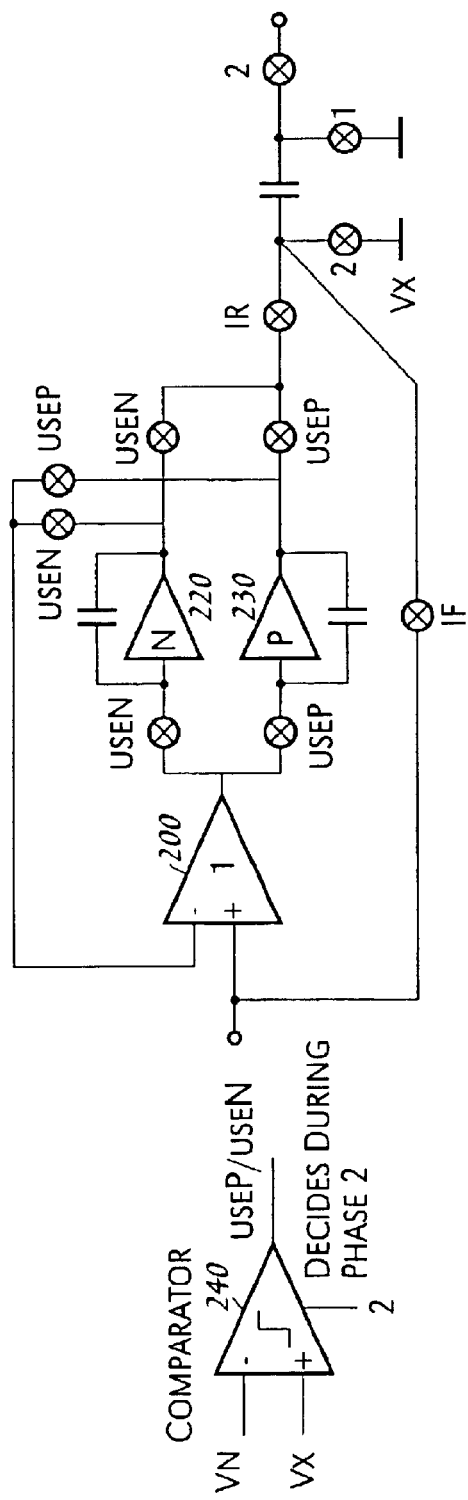
Fig. 2.5
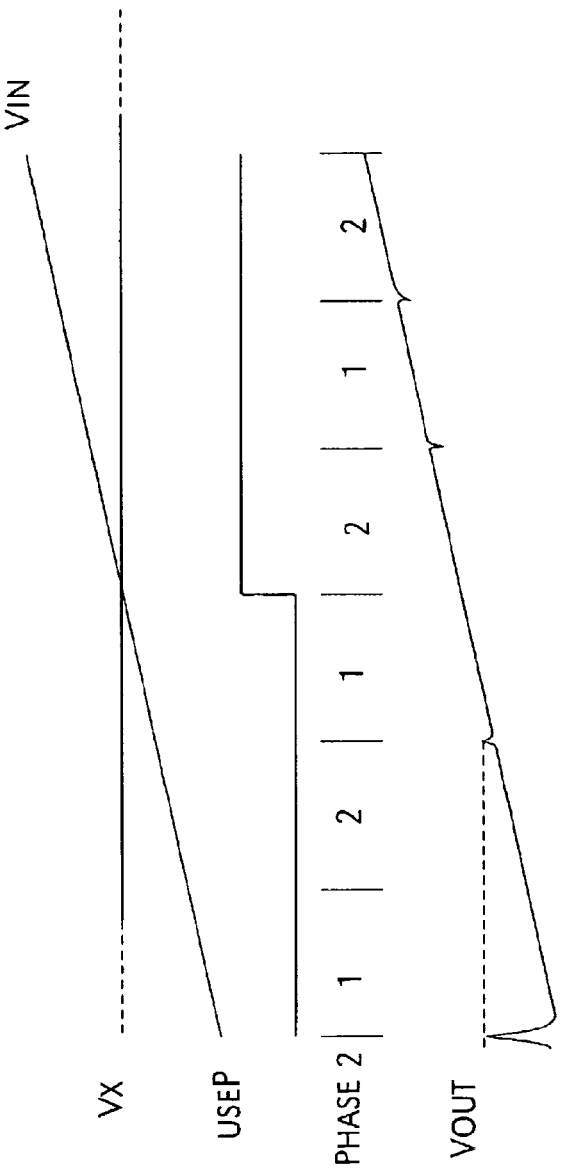
Fig. 2.6
Fig. 2.7
Fig. 2.8

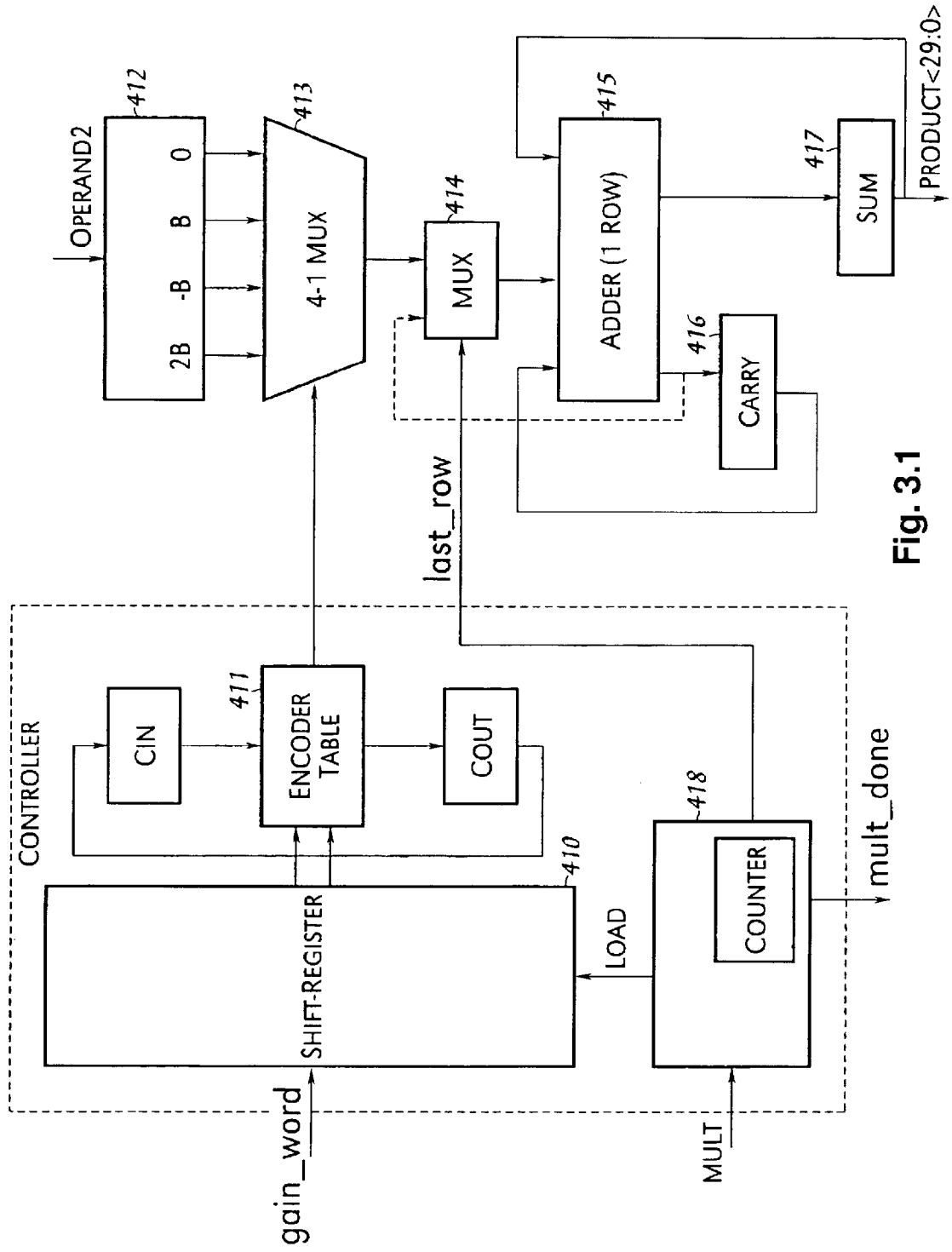
Fig. 3.1

TABLE 2: ENCODING SCHEME PROPOSED
| $A_{i+1}$ | $A_i$ | Operation |
|---|---|---|
| 0 | 0 | $R_i = R_{i-1}/4$ |
| 0 | 1 | $R_i = (R_{i-1} + B)/4$ |
| 1 | 0 | $R_i = (R_{i-1} + 2B)/4$ |
| 1 | 1 | $R_i = (R_{i-1} + 3B)/4$ |
Fig. 3.2 (PRIOR ART)
TABLE 3: CARRY PROPAGATE ENCODING SCHEME
| $C_{in}$ | $A_{i+1}$ | $A_i$ | Operation | $C_{out}$ |
|---|---|---|---|---|
| 0 | 0 | 0 | $R_i = R_{i-1}/4$ | 0 |
| 0 | 0 | 1 | $R_i = (R_{i-1} + B)/4$ | 0 |
| 0 | 1 | 0 | $R_i = (R_{i-1} + 2B)/4$ | 0 |
| 0 | 1 | 1 | $R_i = (R_{i-1} - B)/4$ | 1 |
| 1 | 0 | 0 | $R_i = (R_{i-1} + B)/4$ | 0 |
| 1 | 0 | 1 | $R_i = (R_{i-1} + 2B)/4$ | 0 |
| 1 | 1 | 0 | $R_i = (R_{i-1} - B)/4$ | 0 |
| 1 | 1 | 1 | $R_i = (R_{i-1})/4$ | 1 |
Fig. 3.3 (PRIOR ART)
Fig. 3.4
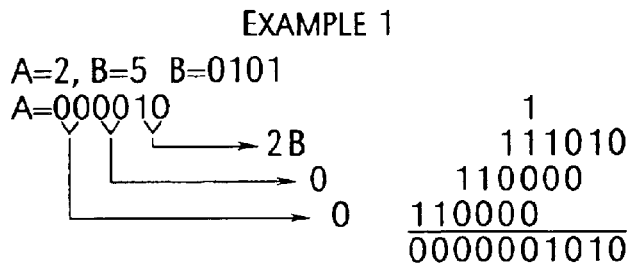
EXAMPLE 1
A=2, B=5  B=0101
A=000010
Fig. 3.5
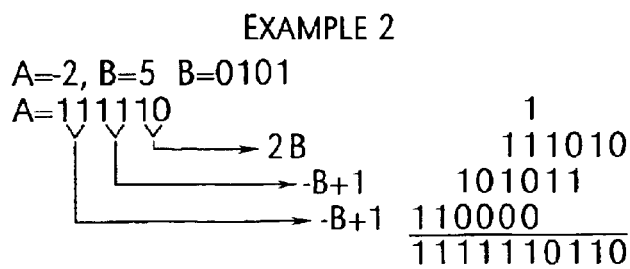
EXAMPLE 2
A=-2, B=5  B=0101
A=111110

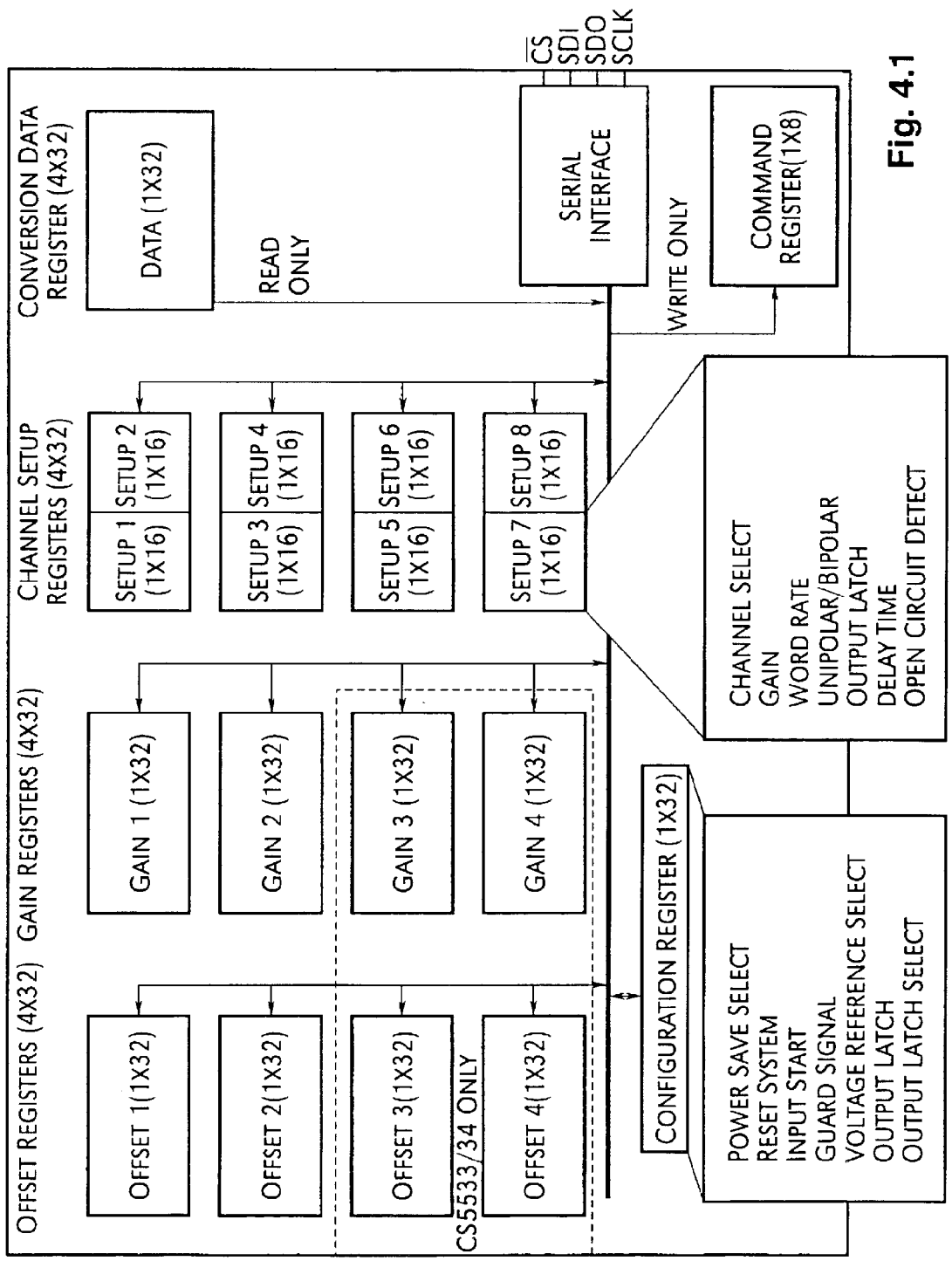
Fig. 4.1

| D7(MSB) | D6 | D5 | D4 | D3 | D2 | D1 | D0 |
|---|---|---|---|---|---|---|---|
| 0 | ARA | CS1 | CS0 | R/W̄ | RSB2 | RSB1 | RSB0 |

| BIT | NAME | VALUE | FUNCTION |
|---|---|---|---|
| D7 | COMMAND BIT, C | 0 | MUST BE LOGIC 0 FOR THESE COMMANDS. |
|  |  | 1 | THESE COMMANDS ARE INVALID IF THIS BIT IS LOGIC 1. |
| D6 | ACCESS REGISTERS AS ARRAYS, ARA | 0 | IGNORE THIS FUNCTION. |
|  |  | 1 | ACCESS THE RESPECTIVE REGISTERS, OFFSET, GAIN, OR CHANNEL-SETUP, AS AN ARRAY OF REGISTERS. THE PARTICULAR REGISTERS ACCESSED ARE DETERMINED BY THE RS BITS. THE REGISTERS ARE ACCESSED MSB FIRST WITH PHYSICAL CHANNEL 0 ACCESSED FIRST FOLLOWED BY PHYSICAL CHANNEL 1 NEXT AND SO FORTH. |
| D5-D4 | CHANNEL SELECT BITS, CS1-CS0 | 00 01 10 11 | CS1-CS0 PROVIDE THE ADDRESS OF ONE OF THE TWO (FOUR FOR CS5533/34) PHYSICAL INPUT CHANNELS. THESE BITS ARE ALSO USED TO ACCESS THE CALIBRATION REGISTERS ASSOCIATED WITH THE RESPECTIVE PHYSICAL INPUT CHANNEL. NOTE THAT THESE BITS ARE IGNORED WHEN READING DATA REGISTER. |
| D3 | READ/WRITE, R/W̄ | 0 | WRITE TO SELECTED REGISTER. |
|  |  | 1 | READ FROM SELECTED REGISTER. |
| D2-D0 | REGISTER SELECT BIT, RSB3-RSB0 | 000 | RESERVED |
|  |  | 001 | OFFSET REGISTER |
|  |  | 010 | GAIN REGISTER |
|  |  | 011 | CONFIGURATION REGISTER |
|  |  | 100 | CONVERSION DATA REGISTER (READ ONLY) |
|  |  | 101 | CHANNEL-SETUP REGISTERS |
|  |  | 110 | RESERVED |
|  |  | 111 | RESERVED |

Fig. 4.2

| D7(MSB) | D6 | D5 | D4 | D3 | D2 | D1 | D0 |
|---|---|---|---|---|---|---|---|
| 1 | MC | CSRP2 | CSRP1 | CSRP0 | CC2 | CC1 | CC0 |

| BIT | NAME | VALUE | FUNCTION |
|---|---|---|---|
| D7 | COMMAND BIT, C | 0<br>1 | THESE COMMANDS ARE INVALID IF THIS BIT IS LOGIC 0.<br>MUST BE LOGIC 1 FOR THESE COMMANDS. |
| D6 | MULTIPLE CONVERSIONS, MC | 0<br>1 | PERFORM FULLY SETTLED SINGLE CONVERSIONS.<br>PERFORM CONVERSIONS CONTINUOUSLY. |
| D5-D3 | CHANNEL-SETUP REGISTER POINTER BITS, CSRP | 000<br>...<br>111 | THESE BITS ARE USED AS POINTERS TO THE CHANNEL-SETUP REGISTERS. EITHER A SINGLE CONVERSION OR CONTINUOUS CONVERSIONS ARE PERFORMED ON THE CHANNEL SETUP REGISTER POINTED TO BY THESE BITS. |
| D2-D0 | CONVERSION/CALIBRATION BITS, CC2-CC0 | 000<br>001<br>010<br>011<br>100<br>101<br>110<br>111 | NORMAL CONVERSION<br>SELF-OFFSET CALIBRATION<br>SELF-GAIN CALIBRATION<br>RESERVED<br>RESERVED<br>SYSTEM-OFFSET CALIBRATION<br>SYSTEM-GAIN CLAIBRATION<br>RESERVED |

Fig. 4.3

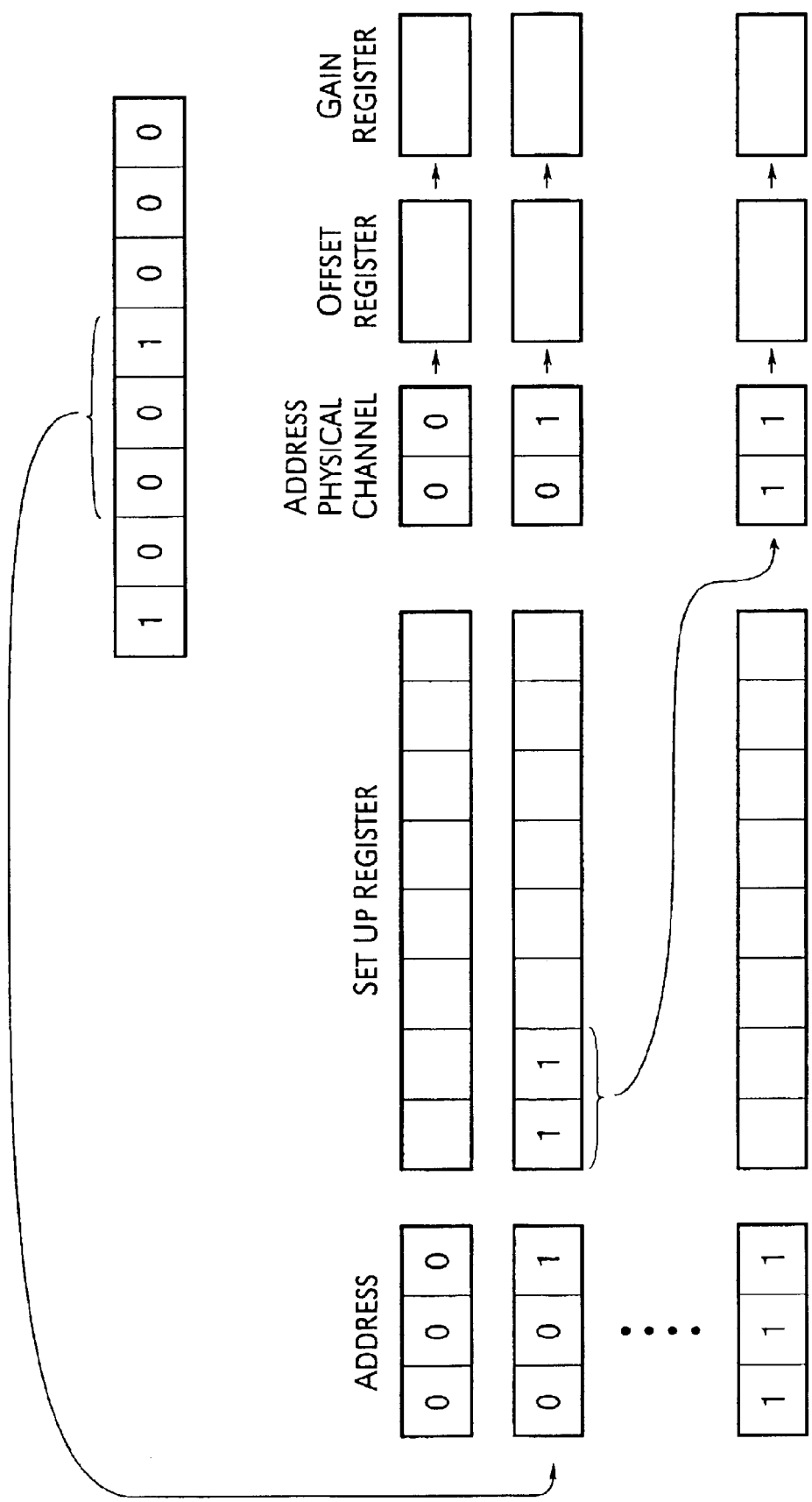
Fig. 4.4

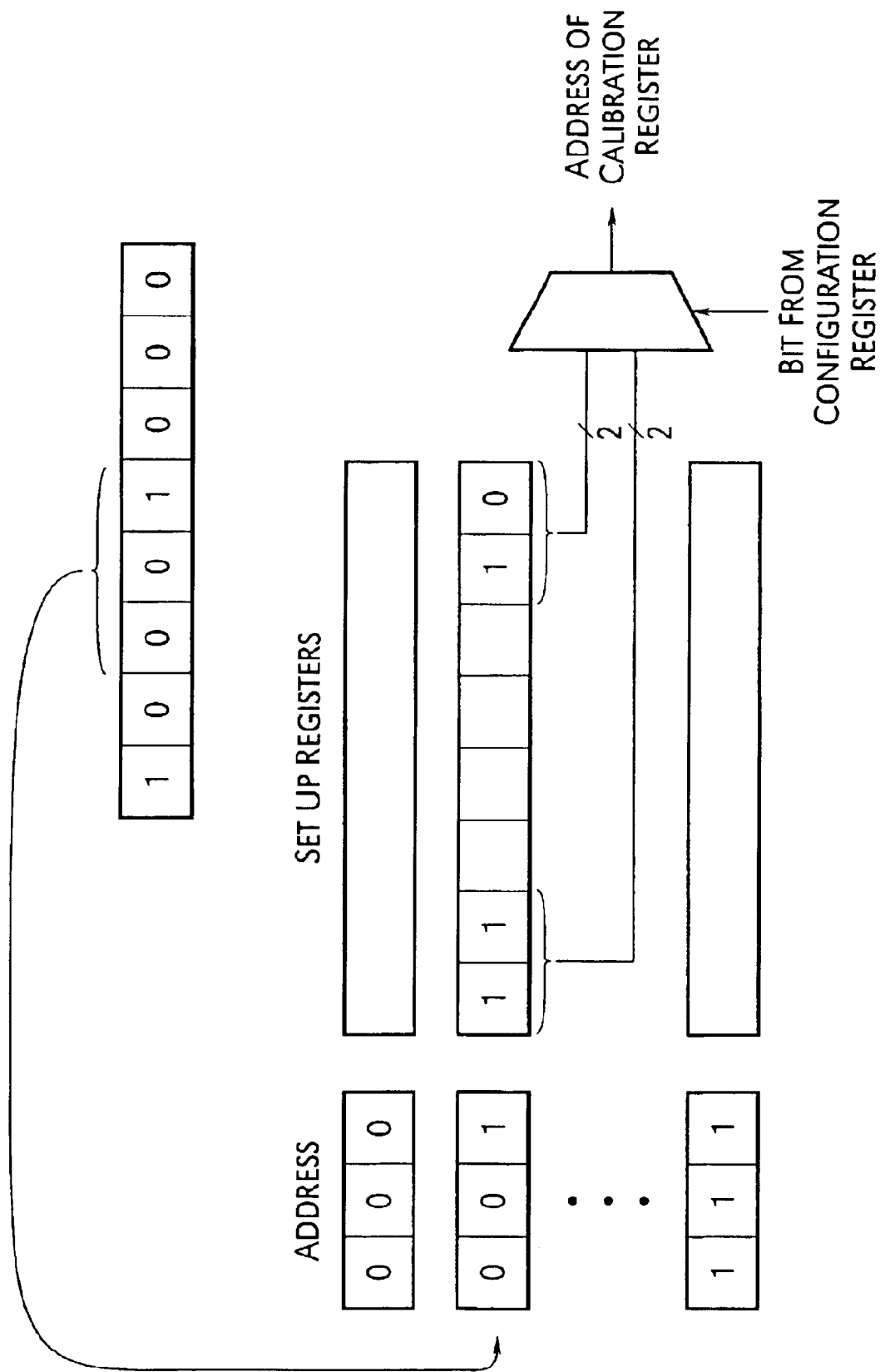
Fig. 4.5

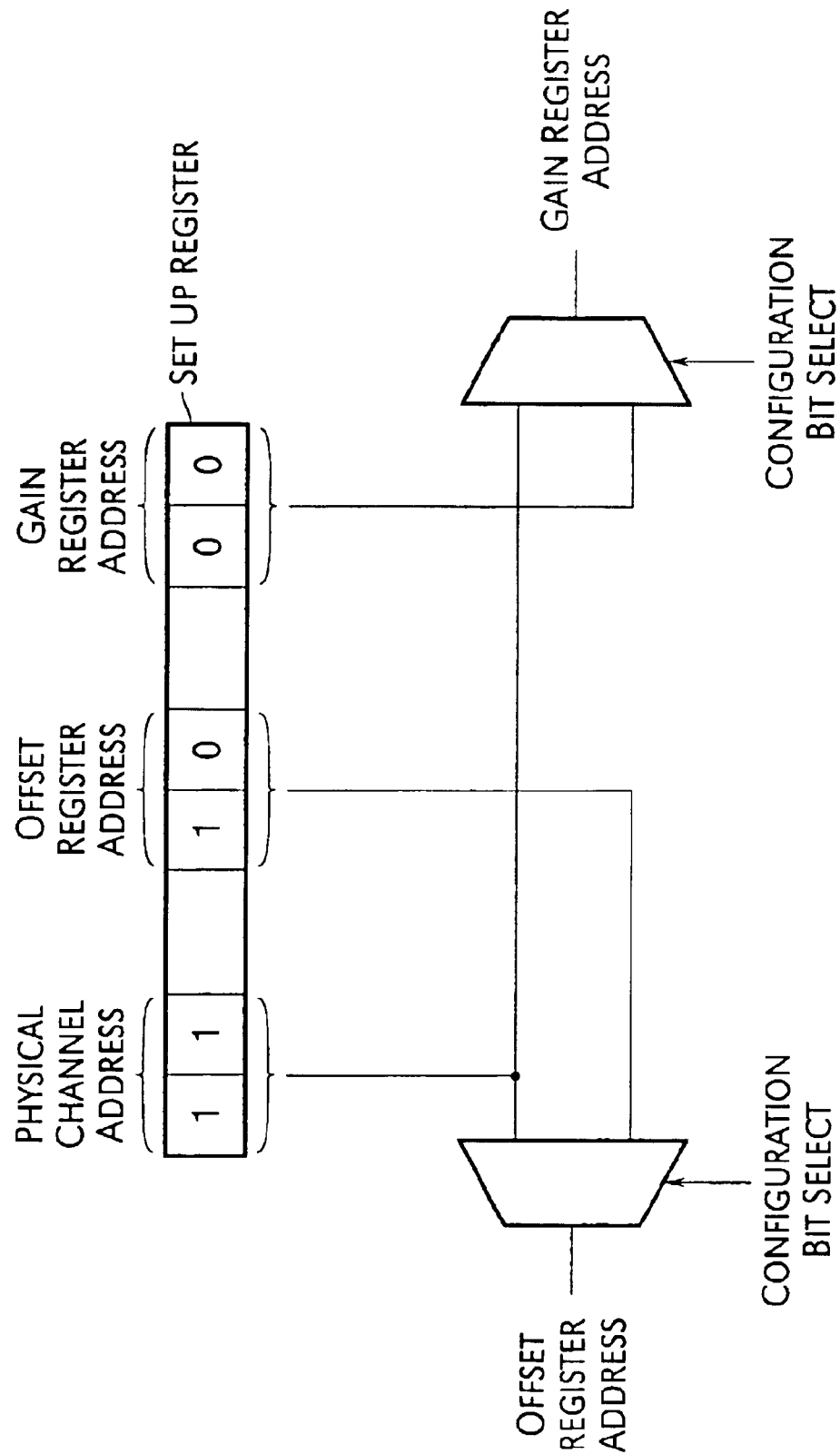
Fig. 4.6

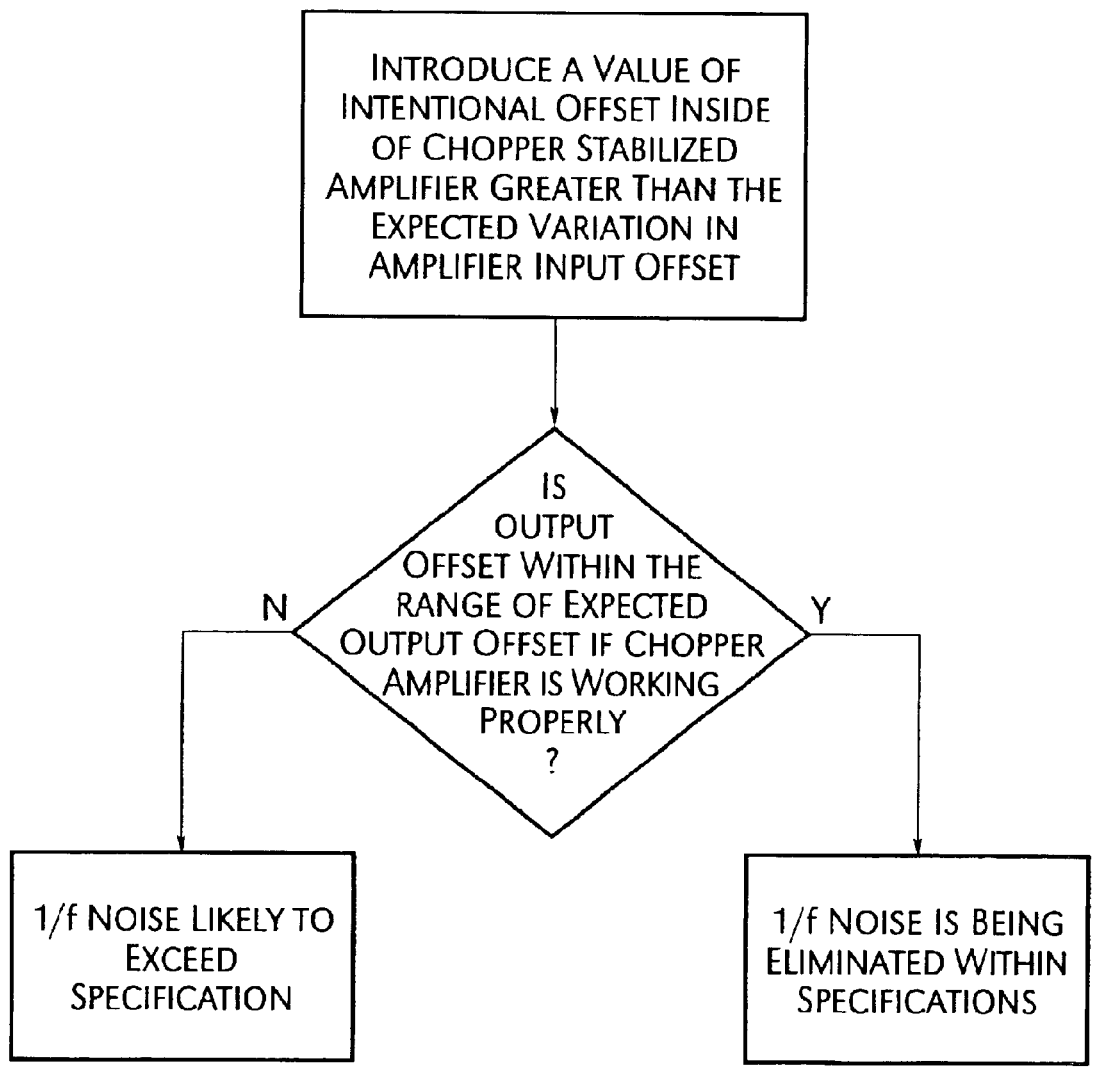
Fig. 5.1

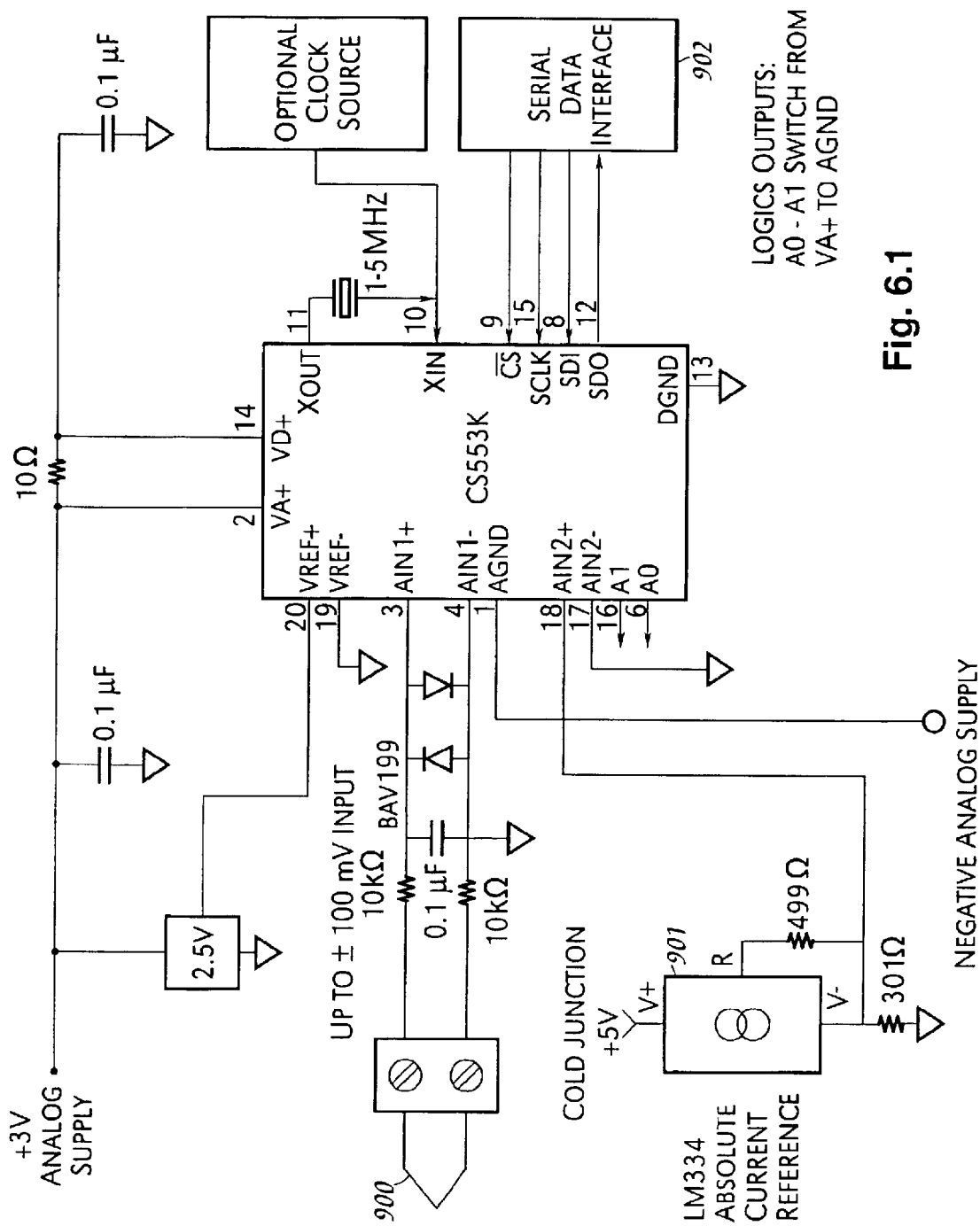
Fig. 6.1

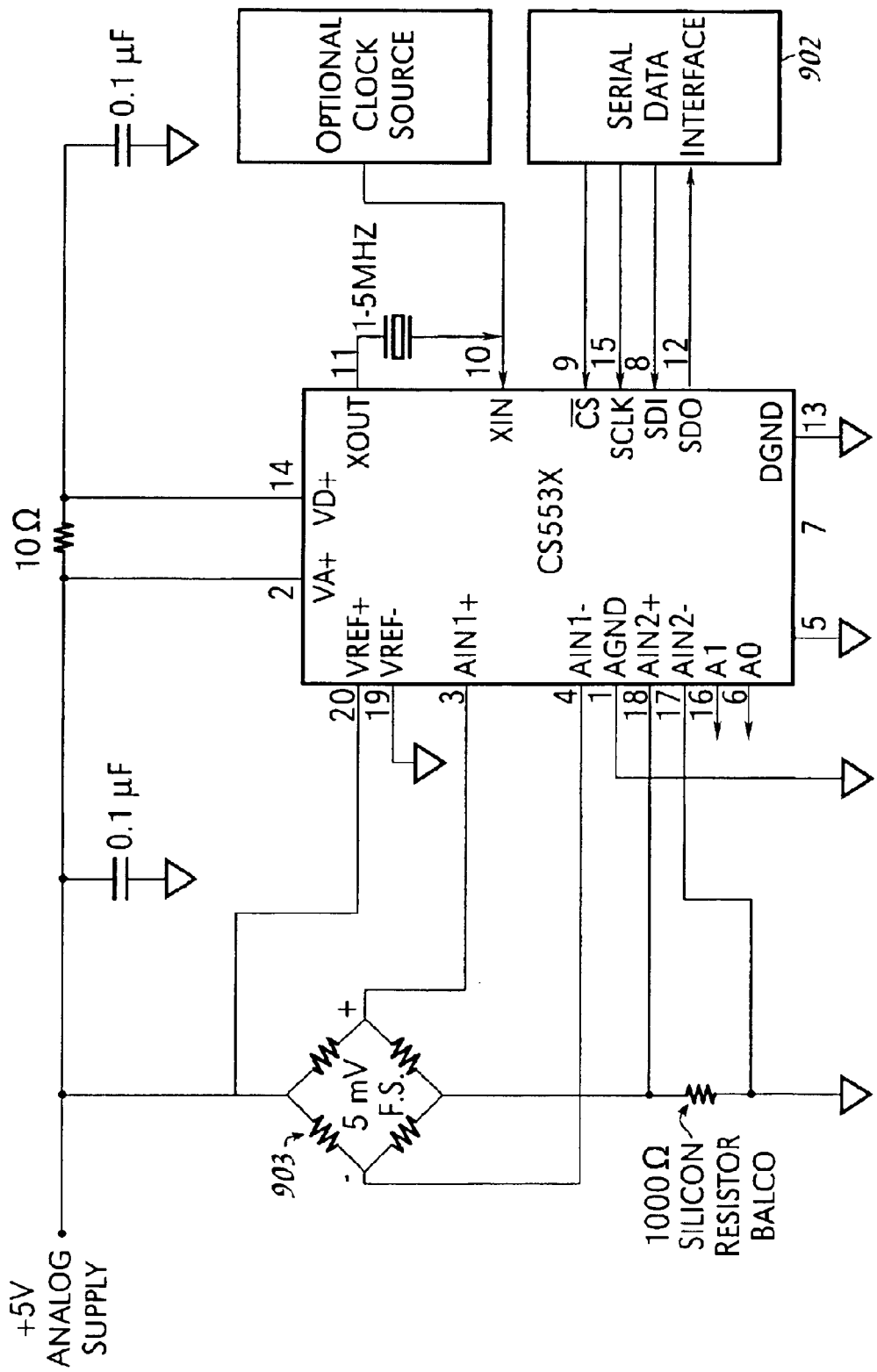
Fig. 6.2

INTEGRATED CIRCUIT WITH A MODE CONTROL SELECTING SETTLED AND UNSETTLED OUTPUT FROM A FILTER

CROSS-REFERENCES TO RELATED APPLICATIONS

This application claims priority to U.S. Provisional Patent Application Ser. No. 60/216,346, filed Jul. 5, 2000, by inventors Axel Thomsen, Sherry Wu, Edwin de Angel, Aryesh Amar, Lei Wang, Eric J. Swanson and Jerome E. Johnston, entitled "ARNOLD PROVISIONAL" which is hereby incorporated by reference in its entirety.

This application is related to U.S. patent application Ser. No. 09/054,542, filed Apr. 3, 1998, by inventors Wai Laing Lee, Axel Thomsen and Dan Kasha, entitled "ANALOG TO DIGITAL SWITCHED CAPACITOR CONVERTER USING A DELTA-SIGMA MODULATOR HAVING VERY LOW POWER, DISTORTION AND NOISE".

This application is related to U.S. patent application Ser. No. 09/321,583, filed May 28, 1999, by inventors Aryesh Amar, Jerome E. Johnston and Donald Keith Coffey, entitled "USE OF POINTERS TO ENHANCE FLEXIBILITY OF SERIAL PORT INTERFACE FOR AN INTEGRATED CIRCUIT WITH PROGRAMMABLE COMPONENTS".

This application is related to U.S. patent application Ser. No. 09/695,702, filed Oct. 25, 2000, by inventors Axel Thomsen and Lei Wang, entitled "TECHNIQUES FOR IMPLEMENTING A ROUGH BUFFER FOR CHARGING A SAMPLING CAPACITOR".

This application is related to U.S. patent application Ser. No. 09/695,706, filed Oct. 25, 2000, by inventors Axel Thomsen, Edwin de Angel, Sherry Wu, Lei Wang and Aryesh Amar, entitled "TECHNIQUES FOR SIGNAL MEASUREMENT USING A CONDITIONALLY STABLE AMPLIFIER".

This application is related to U.S. patent application Ser. No. 09/695,707 filed Oct. 25, 2000, by inventor Edwin de Angel, entitled "A MULTIPLIER WITH EFFICIENT CARRY RIPPLE".

This application is related to U.S. patent application Ser. No. 09/695,708, filed Oct. 25, 2000, by inventors Aryesh Amar, Edwin de Angel and Eric J. Swanson, entitled "INDEPENDENT CONTROL OF CALIBRATION REGISTERS IN A MULTI CHANNEL A-D CONVERTER".

This application is related to U.S. patent application Ser. No. 09/695,703, filed Oct. 25, 2000, by inventor Axel Thomsen, entitled "INDIRECT TECHNIQUES FOR MEASURING 1/f NOISE".

This application is related to U.S. patent application Ser. No. 09/695,705, filed Oct. 25, 2000, by inventors Axel Thomsen, Edwin de Angel, Sherry Wu, Aryesh Amar and Jerome E. Johnston, entitled "APPLICATIONS OF A CONDITIONALLY STABLE INSTRUMENTATION AMPLIFIER TO INDUSTRIAL MEASUREMENT".

FIELD OF THE INVENTION

The invention relates to signal measurement, and more particularly to signal measurement using a conditionally stable amplifier.

BACKGROUND OF THE INVENTION

Techniques for amplification of an analog signal, sampling and converting the signal to digital and processing that signal using digital techniques are known in the art.

Instrumentation amplifiers are commonly used to amplify values of an analog signal. Noise, distortion and offset are critical performance parameters.

Following an instrumentation amplifier in a signal processing chain is typically an analog to digital converter. At its input, the signal is sampled onto a capacitor. To reduce loading effects of the sample process used to sample an analog signal, a rough buffer may be used to precharge the sampling capacitor followed by a period of fine adjustment. The sampled analog signal is converted to digital, such as a one bit digital stream and filtered to produce a multibit digital signal.

Filters for doing such processing, such as FIR filters and FIR sinc filters are known. Some such filters may use coefficients for multiplying digital values. Others, such as Hogenauer filters, described in an article by Eugene B. Hogenauer, entitled "AN ECONOMICAL CLASS OF DIGITAL FILTERS FOR DECIMATION AND INTERPOLATION," published in IEEE Transactions on Acoustics, Speech and Signal Processing, Volume ASSP-29, No. 2, April 1981, perform the filtering without coefficients.

A typical data acquisition system may consist of an ADC preceded by signal conditioning circuitry and followed by digital signal processing and communication circuits. Often the digital signal processing circuitry includes an FIR filter, typically performing the function of decimation and low pass filtering of the signal.

Any FIR filter will have a settling time. The function of the FIR can be described as $$Y(z) = \text{Sum}(A_i * X * z^{-i})$$

where $A_i$ are the coefficients of the filter, X is the input, Y the output and i the index of the taps running from 0 to n. $X * z^{-i}$ then represents the data delayed by i clock cycles.

SUMMARY OF THE INVENTION

When starting a conversion after a reset or a change of input channel, the filter will have an incomplete set of input data as the delayed inputs are all zero from the reset operation. During the time that data are filling up the pipeline of delayed data (until the nth sample of X), the calculation of Y will give a result that holds information about the input, but does not present the data with the same scaling and frequency content as the fully settled filter. Knowledge about the filter coefficients is required to extract information about the input from the unsettled data.

To some users these unsettled data may be useful information, to others they are not. If one were to provide unsettled data to a user who is only interested in settled data, there would be additional software overhead necessary to separate good from bad data.

The invention provides for a select bit that allows the user to specify whether or not he wants to see the unsettled data or only settled data. Any overhead of distinguishing between settled and unsettled data is pulled into the hardware implementation and thus requires no software overhead for the user.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 1.1A is a block diagram of an integrated circuit chip in accordance with one aspect of the invention.

FIG. 1.1B is a block diagram of an integrated circuit chip having a mode select pin by which a user can specify settled or unsettled data in accordance with one aspect of the invention.

FIG. 1.2A illustrates the integrated circuit of FIG. 1.1A with more detail in the analog circuitry portion.

FIG. 1.2B illustrates the integrated circuit of FIG. 1.1A modified to inhibit output until a filter fully settles.

FIG. 1.2C shows a typical FIR filter which can be used in accordance with the invention.

FIG. 1.3 is a schematic diagram of an amplifier architecture used in conjunction with FIGS. 1.1 and 1.2, which includes chopper stabilization.

FIG. 1.4 is a schematic diagram of an architecture of a delta sigma modulator in accordance with one aspect of the invention.

FIG. 1.5A is a high level view of the digital portion of the chip illustrated in FIG. 1.1.

FIG. 1.5B is a view of FIG. 1.5A, modified to include settled mode selection.

FIG. 1.6A is a diagram showing an architecture of the serial port including serial interface and calibration and memory control logic.

FIG. 1.6B is a diagram showing a modification of the serial port of FIG. 1.6A to include settled mode selection.

FIG. 2.0 is a high level schematic diagram of a rough buffer utilized in conjunction with amplifier 110 of FIG. 1.1.

FIG. 2.1 is an implementation of a rough buffer with an n-type output stage.

FIGS. 2.2 and 2.3 show the step response of the rough buffer of FIG. 2.1 to a negative step and to a positive step, respectfully.

FIG. 2.4 shows implementation of a rough buffer with p-type output stage showing the slow and fast responses.

FIG. 2.5 is a schematic diagram of an implementation of a complete rough buffer scheme including a comparator for selection of the proper output stage.

FIGS. 2.6, 2.7, and 2.8 show respectively an input voltage to the rough buffer, a comparator output from the rough buffer implementation shown in FIG. 2.5 and the rough buffer output showing a fast response independent of input polarity.

FIG. 3.1 is a block diagram of a multiplier architecture in accordance with the invention.

FIG. 3.2 illustrates an encoding scheme utilized in conjunction with the multiplier architecture of FIG. 3.1.

FIG. 3.3 illustrates an expansion of the algorithm to show the carry propagate and coding scheme utilized with a multiplier architecture of FIG. 1.

FIG. 3.4 shows an example of the encoding scheme of FIGS. 3.2 and 3.3 as applied in the prior art.

FIG. 3.5 illustrates a multiplication example using two's compliments in the encoding scheme of FIGS. 3.2.

FIG. 4.1 is a register diagram of the serial port 140 showing calibration and SRAM/control logic 150 of FIG. 1.1.

FIG. 4.2 has an illustration of the serial port command structure.

FIG. 4.3 shows more of the serial port command structure shown on FIG. 4.2.

FIG. 4.4 illustrates an example of how a command would be interpreted with dedicated physical channel, gain and offset relationships.

FIG. 4.5 shows an example of pointers used to select a calibration register.

FIG. 4.6 shows the new pointer based register allocation in accordance with one aspect of the invention.

FIG. 5.1 shows a flow diagram of a test algorithm in accordance with one aspect of the invention.

FIG. 6.1 shows a partial schematic, partial blocked diagram of the integrated circuit of FIG. 1 used to measure the output of a thermal couple.

FIG. 6.2 is a partial schematic, partial blocked diagram of the integrated circuit of FIG. 1 used to measure the output of a bridge transducer.

DESCRIPTION OF THE PREFERRED EMBODIMENT

FIG. 1.1A is a block diagram of an integrated circuit chip in accordance with one aspect of the invention. At the left of FIG. 1.1A, a number of analog input terminal pairs, $ain_i+$ $ain_i-$, are shown. The number of analog input terminals is a matter of design choice. In some versions of the chip, only two input pairs are used, whereas in other implementations, four input pairs or more may be utilized. Each of the input pairs is fed to multiplexer 100 which selects the particular input to be applied to programmable instrumentation amplifier 110, described more hereinafter. The output of the programmable instrumentation amplifier 110 is applied to a differential fourth order ΔΣ modulator 120. Once the analog signal is converted to a digital bit stream, it is applied to programmable sinc FIR filter 130 where it is processed and ultimately converted to an output value to be sent to externally connected equipment over serial interface 140. Serial interface 140 contains or has associated with it calibration information storage and control logic 150. A clock generator 160 is used to generate internal timing on the chip.

A latched output 170 is utilized to control external logic. The input of 120 is analog and so everything before and up to the output of the differential fourth order ΔΣ modulator constitutes the analog portion of the signal processing. A separate analog power supply VA+ and VA− is available for this portion of the circuitry. In addition, a separate power source VD+ and DGND are available for powering the digital portion of the chip (e.g. items 130, 140, 150 and 160). A reference input $V_{ref+}$ and $V_{ref-}$ is used for the differential fourth order ΔΣ modulator. An externally supplied capacitor may be applied across terminal C1 and C2 of the programmable instrumentation amplifier 110 to implement antialias filtering.

FIG. 1.1B is a block diagram of an integrated circuit chip having a mode select pin, labeled "mode" by which a user can specify settled or unsettled data in accordance with one aspect of the invention.

FIG. 1.2A is a block diagram showing portions of the chip shown in FIG. 1.1 in more detail. In this rendition, the multiplexer 100 shows two alternative configurations. The upper configuration shows a two input multiplexer whereas the bottom configuration shows a four input multiplexer. As discussed above, the number of signal pairs multiplexed is a matter of design choice.

FIG. 1.2B illustrates the integrated circuit of FIG. 1.1A modified to inhibit output until a filter, labeled "FIR Filter" fully settles.

FIG. 1.2C shows a typical FIR filter which can be used in accordance with the invention. When starting a conversion after a reset or a change of input channel, the filter will have an incomplete set of input data as the delayed inputs are all zero from the reset operation. During the time that data are filling up the pipeline of delayed data (until the nth sample of X), the calculation of Y will give a result that holds information about the input, but does not present the data with the same scaling and frequency content as the fully settled filter. However, if one has knowledge about the filter coefficients one may extract information about the input from the unsettled data; that is, knowing the number of delay increments from the time the input channel is reset or from the time when a new input channel is selected, together with the filter coefficients $A_i$, one may calculate the state of the input. Some user processes may have or may be modified to have such calculation capabilities.

Returning to FIG. 1.2B, when a user requires fully settled information, the user selects settle mode by either applying a select voltage to the "mode" input pin of FIG. 1.1B or by setting a settled mode bit as shown in FIG. 1.6B hereafter.

FIG. 1.3 is a diagram of a four stage chopper stabilized instrumentation amplifier using feed forward compensation utilized as the active amplification element for the programmable gain instrumentation amplifier shown in FIG. 1.2. This amplifier is conditionally stable and uses multipath feed forward compensation and uses a plurality of integration stages I1 through I4. The characteristics of this type of amplifier are described in an article entitled "A FIVE STAGE CHOPPER STABILIZED INSTRUMENTATION AMPLIFIER USING FEED FORWARD COMPENSATION" by Axel Thomsen et al., presented at the VLSI Circuit Symposium 98, a copy of which is attached to the specification and which article is incorporated herein by reference in its entirety, and in U.S. Pat. No. 6,002,299 by Axel Thomsen, which patent is also incorporated herein by reference in its entirety.

The multipath feedforward compensated amplifier is best suited for the low level signal measurement because of the following attributes. It allows for a implementation of chopper stabilization without noise penalties or large chopper artifacts. It also allows one to build a low distortion amplifier without large power consumption.

In a multipath amplifier with chopper stabilization, the offset is often dominated by the input referred offset of the second stage.

In the Multipath Architecture, the first integrator is often followed by attenuation to achieve low unity gain frequency of the integrator while maintaining low noise and reasonable device sizes.

An attenuator will act as gain when calculating the input referred offset of the amplifier. The addition of integrator I0 at the output of I1 before the attenuation reduces the second stage contribution by the attenuation factor used (in the Example 128x). Before $$V_{os} = V_{os2} \cdot 128 \frac{1}{A_{vI}} \cdot \text{After } V_{os} = V_{os2} \cdot 128 \cdot \frac{1}{A_{vI}A_{v0}} + V_{osI} \cdot \frac{1}{A_v}$$

FIG. 1.4 is a block diagram of a differential fourth ordered $\Delta\Sigma$ modulator shown in FIGS. 1.1 and 1.2. This $\Delta\Sigma$ modulator is described in U.S. patent application Ser. No. 09/054,542, filed Apr. 3, 1998, by inventors Wai Laing Lee, Axel Thomsen and Dan Kasha, and entitled ANALOG TO DIGITAL SWITCHED CAPACITOR CONVERTER USING A DELTA-SIGMA MODULATOR HAVING VERY LOW POWER, DISTORTION AND NOISE", referred to above, which application is incorporated herein in its entirety by reference. This type of ADC is very suitable for DC measurement applications. Other analog to digital conversion techniques can be applied here as well. It should be pointed out that it is easy to implement the delta sigma ADC in switched capacitor techniques and achieve a rail to rail input range.

As shown in FIG. 1.1, the output of the differential fourth ordered $\Delta\Sigma$ modulator is applied to programmable sinc FIR filter 130.

FIG. 1.5A shows an overview of the digital circuitry in more detail. Specifically shown is the two stage filter. It is a fixed rate sinc followed by a selectable rate $\text{sinc}^3$ filter. These filters are implemented according to Hogenauer with hardware optimizations, but there are many ways to implement. The $\text{sinc}^3$ is also a Hogenauer. It can be bypassed too.

FIG. 1.5B is a view of FIG. 1.5A, modified to include settled mode selection. When settled mode is selected, control logic 304 asserts control over the serial port to prohibit output of data from the filter(s) until the filter output is fully settled. When the filters are fully settled, the control logic 304 asserts the "settled" signal to the serial port and permits the serial port to transfer output data to the user.

FIG. 1.6A shows the register space in the serial port. This port controls the operation of the port and provides an interface to the user. It is an SPI port and is described more in detail hereafter. Many other implementations are possible, too.

FIG. 1.6B is a diagram showing a modification of the serial port of FIG. 1.6A to include settled mode selection. In this approach, the configuration register 550 includes one or more bits to specify whether settled mode (output of data occurs only when the filters are fully settled) or unsettled mode (data is output substantially continuously regardless of whether the filter is settled or not) is in effect. In this approach, the user sets the desired settled mode by writing to the mode selection bit(s) of the configuration register over the serial port.

This approach is an alternative to the use of a separate "mode" pin shown in FIG. 1.1B.

FIG. 2.0 is a schematic diagram of a rough buffer used in conjunction with a switched capacitor circuit such as might be found used in conjunction with the delta sigma modulator 120 shown in FIG. 1.

A rough buffer amplifier 200 receives a voltage input $V_{in}$ and produces an output, which, when switches IR are closed, will charge capacitor C at an aggressive rate. This permits the capacitor C to approach the input voltage, $V_{in}$, quickly. Once a capacitor C is charged approximately to the input voltage, the rough buffer is switched out by opening switches IR. At the same time, switches IF are closed permitting the capacitor to enter a fine charge mode in which the $V_{in}$ is applied directly across capacitor C permitting the capacitor to settle very quickly to the value of $V_{in}$. Once capacitor C is charged to $V_{in}$, switches IF are opened and switches 2 are closed connecting the charge capacitor C across the input of op-amp 210. A switched capacitor input has input current $C \times V_{in} \times F$. A rough buffer will provide this current so that the current from the signal source is only $C \times V_{error} \times F$, where $V_{error}$ is the residue of the voltage error after rough charging. This reduces the loading on the input source and permits greater accuracy.

In the past, a single stage amplifier, such as a folded cascode has been used. This requires high power consumption on the same order as that consumed by the op amp and reduced output swing due to the cascode nature of the circuit. A two-stage amplifier would provide a wider swing and can provide reduced power when compared to a single stage device.

FIG. 2.1 is a schematic diagram of a two-stage amplifier. In this illustration, the rough buffer amplifier is shown in more detail in an n-device implementation. This approach uses a first stage amplifier and an n-device output stage. The output response of the two-stage amp shown in FIG. 2.1 is shown in FIGS. 2.2 and 2.3. Considering FIG. 2.2, a signal step couples through capacitor $C_c$ to node V2, this turns off device M2, so that the change in $V_{out}$ is only achieved by $I_{bias}$ with a slope of $dV/dt=I_{bias}/C$. The only way to speed this up is to apply additional power which would increase $I_{bias}$.

Considering FIG. 2.3, a step and input voltage couples through capacitor $C_c$ and pulls up $V_2$. This turns on device M2 stronger (there is a quadratic relationship between $I_d$ versus $V_{gs}$) and quickly pulls down node $V_{out}$. Low quiescent current is required, but there is a large current available for the pull down.

There is still however, a remaining problem. If $V_{out}>V_x$, the amplifier is still slower. If an amplifier of opposite devices (e.g., turn all P devices to N devices and all N devices to P devices) is used, the behavior is good for $V_{out}>V_x$ but is slower for $V_x>V_{out}$. This is illustrated in FIG. 2.4.

FIG. 2.5 shows a two-stage amplifier using a comparator to select which output stage to utilize in accordance with the invention.

As shown in FIG. 2.5, two different second stage amplifiers 220 and 230 are utilized. Second stage amp 220 is implemented using n-devices and second stage amp 230 is implemented using p-devices. Two separate paths are utilized selectively for receiving the output of the first stage amplifier 200. One path is selected when the useN switches are closed and the other is selected when the useP switches are closed. A decision as to which path to utilize is made using comparator 240, the output of which is determined by the relationship between $V_N$ and $V_X$. A decision is made during phase 2 which output to select during the phase 1 rough charge. The selection is made such that the fastest response path for a given relationship between $V_n$ and $V_x$ is selected.

The input to the first stage amplifier 200 can be advantageously an input stage that uses rail to rail input. These are known from the prior art. Further, one may use chopper stabilization to remove the offset from the voltage $V_{error}$.

FIGS. 2.6, 2.7 and 2.8 show the transfer function, a step response and the output to the step response of the two-stage amplifier shown in FIG. 2.5, respectively. Specifically, FIG. 2.6 shows relationships between $V_x$ and $V_{IN}$. FIG. 2.7 shows alternating rough charge fine charge phases and shows the state of the output of the comparator useP. Finally, FIG. 2.8 shows the output $V_{out}$ during the various stages of operation.

The net result of this implementation is that there is always a fast response to a change in input signal regardless of the polarity of the input signal.

FIG. 3.1 is a block diagram of a serial multiplier of FIG. 1.5 implementing the encoding scheme shown in FIGS. 3.2 and 3.3 to achieve multiplication. As shown in FIG. 3.1, a gain word is loaded into shift register 410. The encoding scheme is discussed more in U.S. Pat. No. 3,691,359 to Dell et al. However, Dell et al. do not show the architecture of FIG. 3.1, merging in the final pass and two's compliment multiplication. This gain word represents the gain setting specified for the particular channel being processed. The stored gain word is supplied to encoder 411 where a table corresponding to FIG. 3.2 is derived from the gain word stored. The incoming serial bits of the bit to be multiplied are examined two at a time to determine whether 0, B, −B or 2B processing is required in accordance with the table in FIG. 3.2. The selected output is then passed through 4-1 mux 413 to multiplexer 414 where either the output from the 4-1 mux 413 is applied to adder 415 and one output from adder 415 may be selectively recirculated as part of a carry ripple operation to a second input of mux 414, thus saving a row of adders. The output of the summed output from adder 415 is applied into a sum register which can be selectively recirculated to produce the ultimate product at the output of the multiplier. A counter 418 is initiated at the beginning of multiplication and issues a mult_done output when the multiplication has been completed.

FIG. 3.4 and FIG. 3.5 show examples of multiplication in accordance with one aspect of the invention. In example 1 shown in FIG. 3.4, two numbers A=2 and B=5 are to be multiplied together. A is represented in binary as 000010 and B is represented in binary as 0101. Multiplication in accordance with the invention differs from prior art multipliers in several respects. In a first respect, the multiplier A, is analyzed two bits at a time instead of one. Considering first the two at least significant bits of the multiplier A, they are "10." This translates to a multiplication of B by the number 2.2B results in a shift to the left of the numeral B resulting in the four least significant digits of 1010. Each of the more significant pairs of bits in multiplier A are "00." Each of these results in a 0 multiplication of B resulting in 0. Therefore the least four significant bits of the product 0×B will be 0000. As can be seen in example 1, a pair of 1's precedes each of the products resulting from the pair wise multiplication of B. In addition, a single "1" occurs for the first single bit position for which no multiplication was done. This permits proper tracking of the signed bit during execution of the multiplication. Thus the product 2B is preceded by two 1's or in other words 111010 represents 2B where the first two 1's are used for tracking the signed bit and the last four bits are the product of 2×B or 10 (decimal). The 2 bit examination of digits of the multiplier result in a two bit shift for each pair of bits examined. This results then in a four layer addition shown in example 1. When all of these binary numbers are added, the correct results shows at the bottom, namely 10, or "0000001010."

Example 2 described in FIG. 3.5 is the same as example 1 except that the multiplier is a negative number, namely −2. The representation of a negative number is done using a two's complement of the positive number. In other words, −2 is equal to the two's complement of 2 or 111110. Again, considering the two lest significant bits of the multiplier A, namely 10, one will multiply the number B by the number 2 which produces the same result that occurred in the previous example. Each of the next two pairs of bits is 11. The first 11 has a carry in of 0. The remaining value A−B comes from table 3 of FIG. 3.5. The next 11 has a carry in of 1 resulting in a value of zero from table 3 preceded by a sign and sign extension bits "11" in a 3B representation. 3B=4B−B.

The family of chips shown in FIG. 1 is designed to support a technique for performing data conversion which greatly increases the use of calibration registers.

This is accomplished through use of a group of setup registers, a configuring register, offset and gain calibration registers, and a serial port command structure.

The setup registers contain logical channels to be converted. Each logical channel contains bits which are used to specify conversion options such as conversion rates, gain selection, unipolar/bipolar input span, selection of the physical channel to be converted, etc.

The integrated circuits provide offset and chain calibration registers for each physical channel. These registers hold calibration results and are also writable by the user contained dedicated offset and gain calibration registers for each physical channel. This dedicated pair of registers results into a non-optimal utilization of silicon area, as the user who intends to connect only a subset of available channels and doesn't get to use the registers dedicated to the unused channels. The approach according to the invention rectifies the problem by allowing the user to assign any register to any physical channel.

FIG. 4.1 is a register diagram of the serial port 140 of FIG. 1 showing calibration and SRAM/control logic 150 of FIG. 1.1.

FIG. 4.2 is a block diagram of a serial multiplier of FIG. 3.6 implementing the encoding scheme shown in FIGS. 4.1.0 and 4.1.1 to achieve multiplication. The data structure shown in FIGS. 4.2 and 4.3 describes how to access the offset and gain registers through serial port.

For example, if a command issued is 21 (Hex), it translates to writing offset register 3. (Offset 3 in FIG. 9) similarly 12 (Hex) translates to writing gain register 2 (Gain 2 in FIG. 1). This way the user can read or write to any offset/gain register through serial port. These registers are also written during calibration. They get used during normal conversion to adjust offset and gain of the converter.

FIG. 4.3 shows more of the serial port command structure shown on FIG. 4.2.

The following command byte structure describes the conversion commands.

Consider the example of FIG. 4.4. Discussion of the corresponding Figure. In the Example shown on FIG. 4.4, the first two bits (those shown to the left of the bits stream shown in the Example) indicate that the data structure represents a command and that the command specifies performing a fully settled single conversion. The next three bits however are pointer bits to the channel set up register. In this case, the bits "001" point to set up register number one. The first two bits of set up register number 1 are pointers to the physical channel address, in this case 11. The physical channel address then identifies the gain and off set registers as well since, in this implementation, there is a dedicated relationship between them.

The command 88 (Hex) means, convert using setup register 2. If setup register 2 contains physical channel information as depicted (79), it means that physical channel 4 should be converted using offset register 4 and gain register 4.

As mentioned before, this results in a non-optimal use of registers. If physical channel addresses can be delinked from the calibration register address, we can achieve independent control of these registers.

One way to achieve the desired effect is by using a bit of configuration register and more bits of setup registers as shown in FIG. 4.5.

Here the command 88 (Hex), points to setup register 2, with physical channel 4 to be converted. If configuration bit select is high, the address of the gain and offset registers now comes from the two LSB bits of setup register being pointed to (setup register 2 in this example). Thus any physical channel can be combined with any offset/gain register pair. In the above example, physical channel 3 is to be converted using offset-register 3 and gain register 3. Note that the offset and gain registers are used in pairs so far. To offer total control over the choice of offset or gain register, more bits of setup registers are needed as shown in FIG. 4.6.

Returning to FIG. 1.1, when verifying the performance of an integrated circuit chip, such as shown in FIG. 1, it is desirable to know whether or not the 1/f performance of components, such as the programmable instrumentation amplifier 110, is within specifications. To actually measure the 1/f noise at a frequency of, for example, 0.1 Hz requires approximately 10 seconds of measurement time. Such a long testing interval is inconsistent with a desire to mass produce integrated circuit chips in high volumes.

FIG. 5.1 is a flow chart of a process for verifying that 1/f noise is within specifications in a short internal even if very low frequencies are of interest. Essentially the approach used uses a determination that chopper stabilization is working appropriately as a substitute for actually testing 1/f noise. If chopper stabilization is working properly, then most of the 1/f noise would be eliminated.

Turning to FIG. 5.1, a test is conducted by introducing a value of intentional offset inside the chopper stabilized amplifier greater than the expected random variation in amplifier input offset (800). A check is made whether the output offset is within the range of expected output offset which would occur if chopper amplification were working properly (810). If the amount of offset is within that range (810-Y), the 1/f noise is assumed to be eliminated within specification (830). If it is not (810-N), the 1/f noise is presumed to exceed specifications and the part is rejected (820).

FIG. 6.1 is a partial schematic, partial block diagram of the integrated circuit of FIG. 1 used to measure the output of a thermocouple. A thermocouple 900 is connected to inputs ain1+ and ain1−. A cold junction 901 produces a signal equivalent to a thermocouple at room temperature and that signal is applied across inputs ain2+ and ain2−. The signals from each of these two sources can be processed and provided to the serial data interface 902 which connects with a serial port on the chip to provide the user access to the temperature information resulting from the signal processing done on the chip. Exemplary power and biasing information is shown in the drawing.

FIG. 6.2 is a partial schematic, partial block diagram of the integrated circuit of FIG. 1 used to measure the output of a bridge transducer.

A bridge transducer might be used in a weigh scale and might have an output signal of less than 5 mV. The mechanical elements of a weigh scale have a temperature coefficient. It is required to measure the temperature of the system. This is often done using a 5th resistor that is connected to either the positive or negative supply. The resolution requirement for this measurement is such that amplification before conversion is not necessary. It is a very desirable feature in a weigh scale application to be able to convert a rail/rail input signal without external components. The addition of a bypass as a unity gain mode to the switched capacitor based ADC with rail to rail input range allows the easy implementation of this measurement. The real goal is low input current on the switched capacitor adc. It is required, when doing this, to provide active rough buffering so that the switched capacitor input currents described earlier, which would be drawn through the resistors, do not corrupt the precision of the measurement. In this application, it is also desirable to use rough buffering and reduced input currents on the reference. Alternatively a rough charge buffer could be replaced with a regular buffer circuit that is not bypassed during a fine charge phase. This allows the use of resistive voltage division on the reference (for better SNR of the measurement) or protection resistors in place.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. An integrated circuit comprising:
   a. an analog to digital converter;
   b. a finite impulse response (FIR) filter; and
   c. an output mechanism selectively providing either only fully settled data from the FIR filter or all data from the FIR filter, including unsettled data, the output mechanism comprising one or more bits of a register of the integrated circuit which a user set to control the selection of the fully settled data from the FIR filter or all of the data from the FIR filter, including the unsettled data.

2. The integrated circuit of claim 1 in which said one or more bits of a register of the integrated circuit are set over a serial port interface.

3. The integrated circuit of claim 1 in which the analog to digital converter is a delta sigma modulator.

4. The integrated circuit of claim 1 in which the FIR filter is a decimation filter.

5. An integrated circuit comprising:
   a. an analog to digital converter;
   b. a finite impulse response (FIR) filter; and
   c. an output mechanism selectively providing either only fully settled data from the FIR filter or all data from the FIR filter, including unsettled data in which the output mechanism comprises an external pin on the integrated circuit to which a user apply a control signal to control the selection of fully settled data from the FIR filter or all data from the FIR filter, including unsettled data.

* * * * *

UNITED STATES PATENT AND TRADEMARK OFFICE
CERTIFICATE OF CORRECTION

PATENT NO. : 6,857,002 B1
DATED : February 15, 2005
INVENTOR(S) : Axel Thomsen et al.

It is certified that error appears in the above-identified patent and that said Letters Patent is hereby corrected as shown below:

Column 6,
Line 10, "since" should be -- $sinc^5$ --.

Column 11,
Line 12, after "user" insert -- can --.

Signed and Sealed this

Third Day of May, 2005

JON W. DUDAS
*Director of the United States Patent and Trademark Office*